United States Patent
Matsushima

(10) Patent No.: US 8,624,275 B2
(45) Date of Patent: *Jan. 7, 2014

(54) ORGANIC LIGHT-EMITTING PANEL FOR CONTROLLING AN ORGANIC LIGHT EMITTING LAYER THICKNESS AND ORGANIC DISPLAY DEVICE

(75) Inventor: Hideaki Matsushima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/434,070

(22) Filed: Mar. 29, 2012

(65) Prior Publication Data
US 2012/0193658 A1    Aug. 2, 2012

Related U.S. Application Data

(63) Continuation of application No. PCT/JP2010/006149, filed on Oct. 15, 2010.

(51) Int. Cl.
| H01L 29/18 | (2006.01) |
| H01L 29/20 | (2006.01) |
| H01L 33/00 | (2010.01) |
| H01L 29/08 | (2006.01) |
| H01L 21/00 | (2006.01) |

(52) U.S. Cl.
USPC .......... 257/89; 257/88; 257/40; 257/E51.018; 257/E51.022; 438/34; 438/35

(58) Field of Classification Search
USPC ............. 257/40, 88, 89, E27.119, E51.018, 257/E51.022; 438/28, 34, 35; 313/504
See application file for complete search history.

(56) References Cited

U.S. PATENT DOCUMENTS

| 5,443,922 A | 8/1995 | Nishizaki et al. |
| 6,388,377 B1 | 5/2002 | Kobayashi et al. |

(Continued)

FOREIGN PATENT DOCUMENTS

| JP | 05-163488 | 6/1993 |
| JP | 2002-222695 | 8/2002 |

(Continued)

OTHER PUBLICATIONS

U.S. Appl. No. 13/717,930 to Hideaki Matsushima, filed Dec. 28, 2012.

(Continued)

*Primary Examiner* — Fernando L Toledo
*Assistant Examiner* — Aaron Gray
(74) *Attorney, Agent, or Firm* — Greenblum & Bersntein, P.L.C.

(57) ABSTRACT

A pixel in the panel includes sub-pixels 100a, 100b, and 100c. Non-light-emitting cells 100d and 100e are provided between the pixel and adjacent pixels on both sides thereof, respectively. The organic light-emitting layer of sub-pixel 100a and non-light-emitting cell 100d are separated by bank 105a. Similarly, the organic light-emitting layer of sub-pixel 100c and non-light-emitting cell 100e are separated by bank 105d; the organic light-emitting layers of sub-pixels 100a and 100b are separated by bank 105b; and the organic light-emitting layers of sub-pixels 100b and 100c are separated by bank 105c. Inclination angle θaa of sidewall 105aa of bank 105a adjacent to sib-pixel 100a and inclination angle θdc of sidewall 105dc of bank 105d adjacent to sib-pixel 100c are larger than other inclination angles θba, θbb, θcb, and θcc.

19 Claims, 21 Drawing Sheets

(56) References Cited

U.S. PATENT DOCUMENTS

| | | | |
|---|---|---|---|
| 6,559,604 B2 | 5/2003 | Lu et al. | |
| 6,762,552 B1 | 7/2004 | Duineveld et al. | |
| 7,034,453 B2 | 4/2006 | Kai et al. | |
| 7,038,651 B2 | 5/2006 | Nitta et al. | |
| 7,214,959 B2 | 5/2007 | Seki et al. | |
| 7,332,854 B2 | 2/2008 | Kai et al. | |
| 7,352,350 B2 | 4/2008 | Nitta et al. | |
| 7,642,701 B2 | 1/2010 | Kai et al. | |
| 7,932,518 B2 | 4/2011 | Seki et al. | |
| 7,994,711 B2 | 8/2011 | Nakamura et al. | |
| 8,129,902 B2 | 3/2012 | Kai et al. | |
| 8,193,699 B2 | 6/2012 | Fujioka et al. | |
| 2002/0064966 A1 | 5/2002 | Seki et al. | |
| 2002/0079833 A1 | 6/2002 | Kobayashi et al. | |
| 2002/0158835 A1* | 10/2002 | Kobayashi et al. | 345/100 |
| 2003/0179221 A1 | 9/2003 | Nitta et al. | |
| 2004/0021413 A1* | 2/2004 | Ito et al. | 313/504 |
| 2004/0119419 A1 | 6/2004 | Kai et al. | |
| 2004/0166761 A1 | 8/2004 | Seki et al. | |
| 2005/0237780 A1 | 10/2005 | Sakai | |
| 2005/0264186 A1 | 12/2005 | Seki et al. | |
| 2005/0264187 A1 | 12/2005 | Seki et al. | |
| 2005/0266169 A1 | 12/2005 | Seki et al. | |
| 2006/0158107 A1 | 7/2006 | Kai et al. | |
| 2006/0176261 A1 | 8/2006 | Nitta et al. | |
| 2006/0283384 A1* | 12/2006 | Yamazaki et al. | 118/300 |
| 2007/0018152 A1 | 1/2007 | Seki et al. | |
| 2007/0029929 A1 | 2/2007 | Nakamura et al. | |
| 2007/0241664 A1 | 10/2007 | Sakamoto et al. | |
| 2008/0036374 A1 | 2/2008 | Okano | |
| 2008/0290789 A1 | 11/2008 | Kai et al. | |
| 2008/0315760 A1 | 12/2008 | Seki et al. | |
| 2009/0009075 A1 | 1/2009 | Seki et al. | |
| 2009/0096364 A1 | 4/2009 | Fujii et al. | |
| 2009/0115318 A1 | 5/2009 | Gregory et al. | |
| 2009/0160322 A1 | 6/2009 | Yoshida et al. | |
| 2009/0284144 A1 | 11/2009 | Fujioka et al. | |
| 2009/0302333 A1 | 12/2009 | Seki et al. | |
| 2010/0102343 A1 | 4/2010 | Ono et al. | |
| 2010/0164372 A1 | 7/2010 | Kai et al. | |
| 2011/0180821 A1 | 7/2011 | Matsushima | |
| 2011/0198623 A1 | 8/2011 | Matsushima | |
| 2011/0198624 A1 | 8/2011 | Matsushima | |
| 2012/0025699 A1 | 2/2012 | Okumoto et al. | |
| 2012/0091440 A1 | 4/2012 | Matsushima | |
| 2012/0091441 A1 | 4/2012 | Matsushima | |
| 2012/0091483 A1 | 4/2012 | Matsushima | |
| 2012/0138973 A1 | 6/2012 | Matsushima | |

FOREIGN PATENT DOCUMENTS

| | | |
|---|---|---|
| JP | 2002-358983 | 12/2002 |
| JP | 2004-192935 | 7/2004 |
| JP | 2005-267984 | 9/2005 |
| JP | 2006-140205 | 6/2006 |
| JP | 2006-185869 | 7/2006 |
| JP | 2007-073499 | 3/2007 |
| JP | 2007-165167 | 6/2007 |
| JP | 2007-287354 | 11/2007 |
| JP | 2007-310156 | 11/2007 |
| JP | 2007-311235 | 11/2007 |
| JP | 2009-054608 | 3/2009 |
| JP | 2009-277578 | 11/2009 |
| JP | 2009-277590 | 11/2009 |
| JP | 2010-225515 | 10/2010 |
| WO | 99/12397 | 3/1999 |
| WO | 2008/105153 | 9/2008 |

OTHER PUBLICATIONS

U.S. Appl. No. 13/716,744 to Hideaki Matsushima, filed Dec. 17, 2012.
United States Office Action in U.S. Appl. No. 13/091,652, dated Mar. 26, 2013.
United States Office Action in U.S. Appl. No. 13/082,674, dated Mar. 21, 2013.
United States Office Action in U.S. Appl. No. 13/091,667, dated Mar. 25, 2013.
United States Office Action in U.S. Appl. No. 13/313,214, dated Mar. 12, 2013.
United States Office Action in U.S. Appl. No. 13/309,775, dated Mar. 4, 2013.
United States Office Action in U.S. Appl. No. 13/309,768, dated Feb. 28, 2013.
United States Office Action in U.S. Appl. No. 13/313,206, dated Mar. 5, 2013.
International Search Report in PCT/JP2010/006149, dated Dec. 28, 2010.
U.S. Appl. No. 13/091,652 to Hideaki Matsushima, filed Apr. 21, 2011.
U.S. Appl. No. 13/082,674 to Hideaki Matsushima, filed Apr. 8, 2011.
U.S. Appl. No. 13/091,667 to Hideaki Matsushima, filed Apr. 21, 2011.
U.S. Appl. No. 13/313,214 to Hideaki Matsushima, filed Dec. 7, 2011.
U.S. Appl. No. 13/309,775 to Hideaki Matsushima, filed Dec. 2, 2011.
U.S. Appl. No. 13/309,768 to Hideaki Matsushima, filed Dec. 2, 2011.
U.S. Appl. No. 13/313,206 to Hideaki Matsushima, filed Dec. 7, 2011.
International Search Report in PCT/JP2009/007118, mailing date of Mar. 2, 2010.
International Search Report in PCT/JP2009/007082, mailing date of Mar. 2, 2010.
International Search Report in PCT/JP2009/007092, mailing date of Mar. 2, 2010.
International Search Report in PCT/JP2010/006126, mailing date of Jan. 18, 2011.
International Search Report in PCT/JP2010/006139, mailing date of Jan. 18, 2011.
International Search Report in PCT/JP2010/006144, mailing date of Jan. 18, 2011.
International Search Report in PCT/JP2010/006145, mailing date of Jan. 18, 2011.
United States Office Action in U.S. Appl. No. 13/082,674, dated Oct. 17, 2012.
United States Office Action in U.S. Appl. No. 13/091,667, dated Oct. 17, 2012.
International Search Report in PCT/JP2010/006125, mailing date of Dec. 7, 2010.
International Search Report in PCT/JP2010/006143, mailing date of Jan. 11, 2011.
International Preliminary Examination Report in PCT/JP2010/006125, mailing date of Dec. 12, 2011.
International Preliminary Examination Report in PCT/JP2010/006143, mailing date of Dec. 8, 2011.
Notice of Allowance in U.S. Appl. No. 13/082,674, dated Jun. 17, 2013.
Notice of Allowance in U.S. Appl. No. 13/091,667, dated Jun. 12, 2013.
Korean Office Action from Korean Patent Office in Korean Patent Application No. 2011-7029074, dated May 27, 2013.
Notice of Allowance in U.S. Appl. No. 13/091,652, dated Jun. 27, 2013.
United States Office Action in U.S. Appl. No. 13/313,214, dated Jul. 8, 2013.
United States Office Action in U.S. Appl. No. 13/309,775, dated Jul. 8, 2013.
United States Office Action in U.S. Appl. No. 13/309,768, dated Jul. 8, 2013.
United States Office Action in U.S. Appl. No. 13/313,206, dated Jul. 8, 2013.

* cited by examiner

FIG. 6

| Taper angle (θ) | Small ←――――――――――――――→ Large |
| --- | --- |
| Pinning location (H) | Low ←――――――――――――――→ High |
| Film thickness (T) | Thick ←――――――――――――――→ Thin |

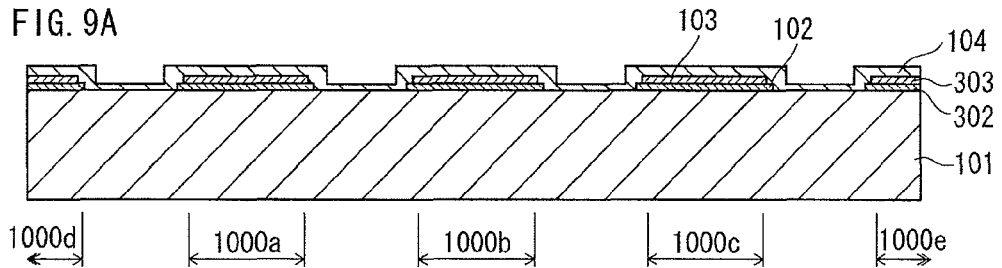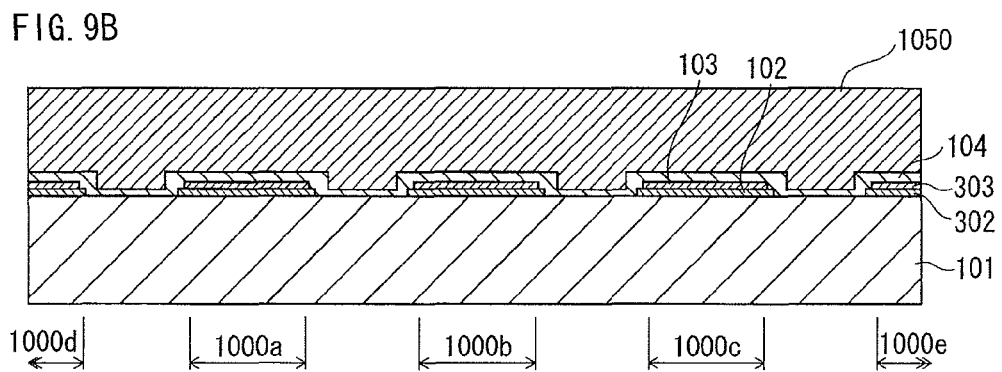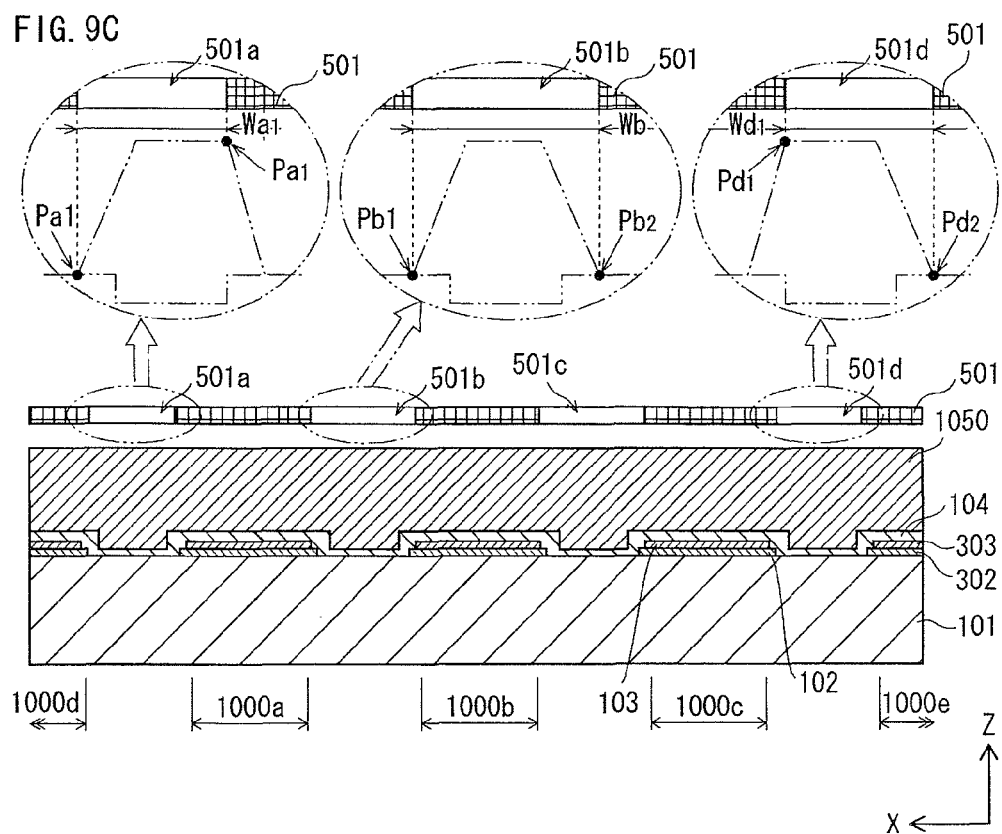

FIG. 10A
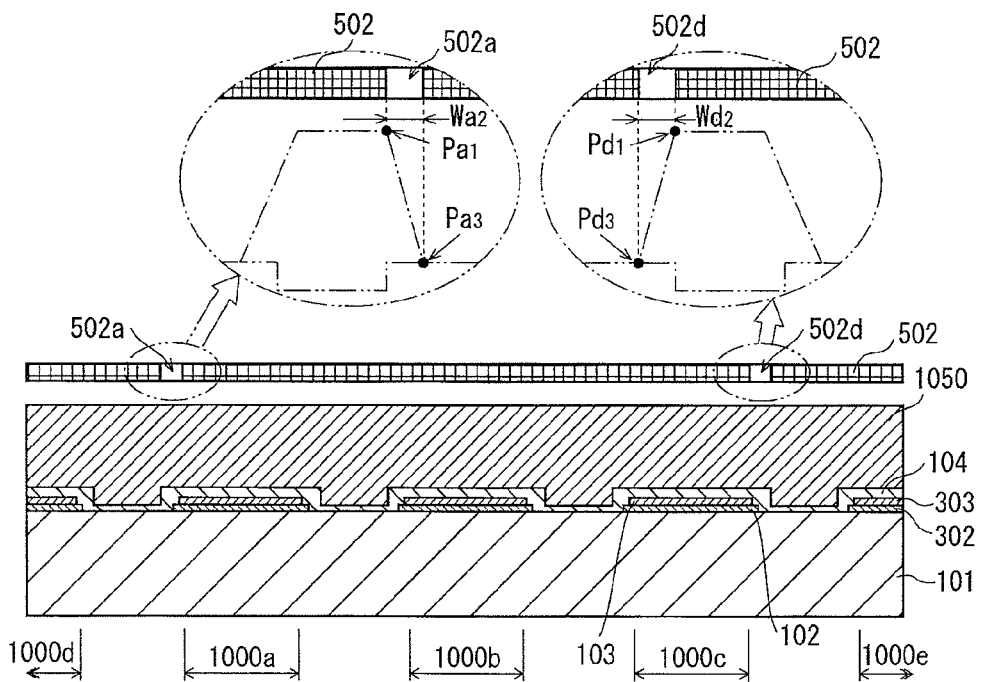
FIG. 10B
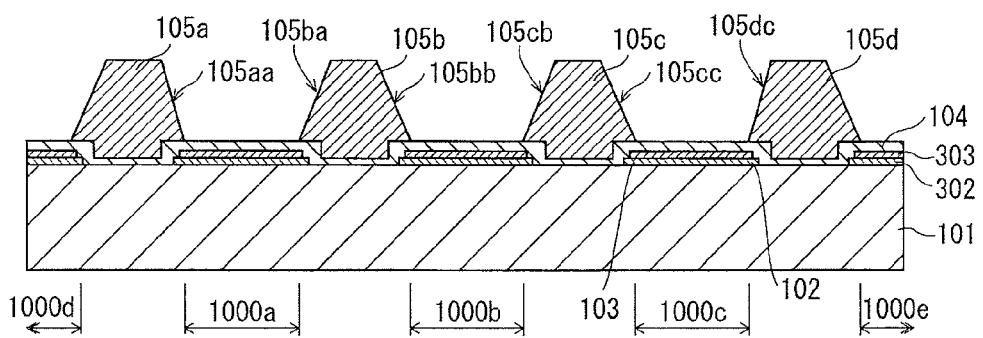
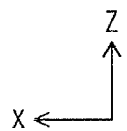

FIG. 13A
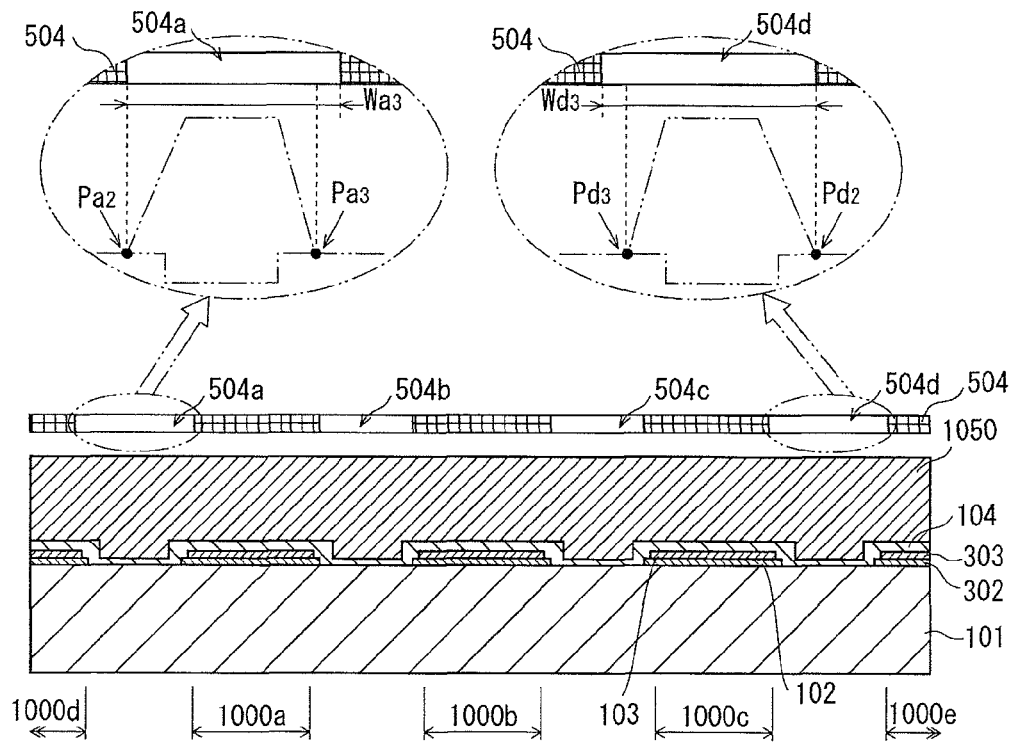
FIG. 13B
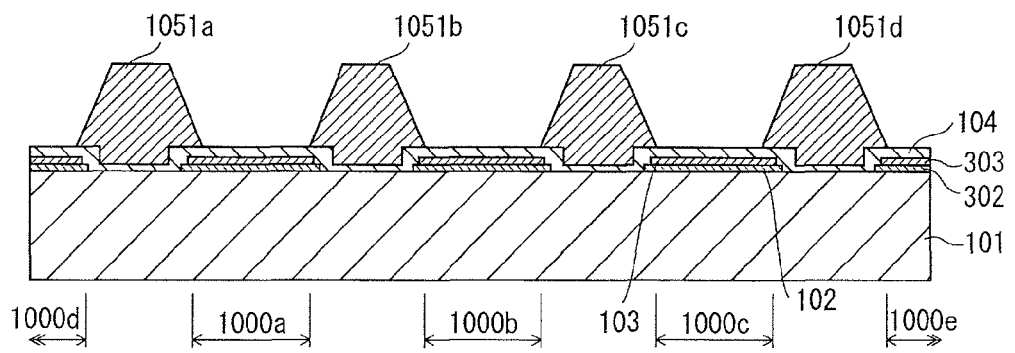
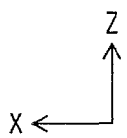

FIG. 14A
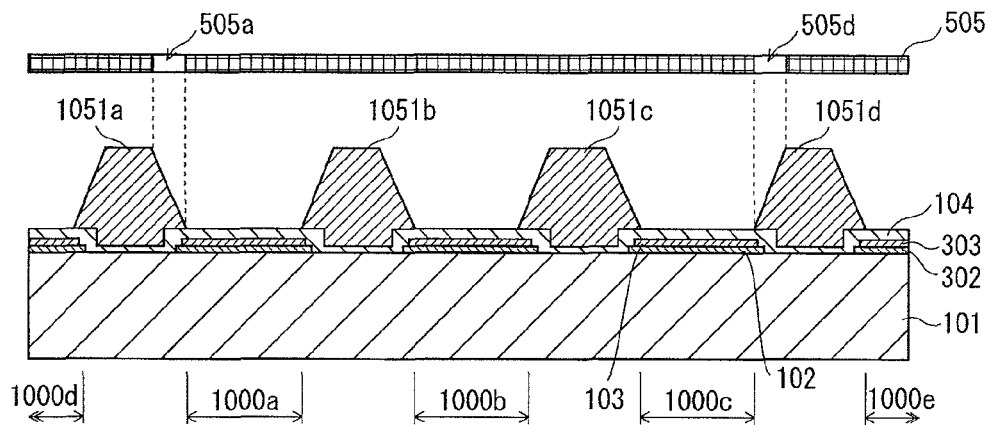
FIG. 14B
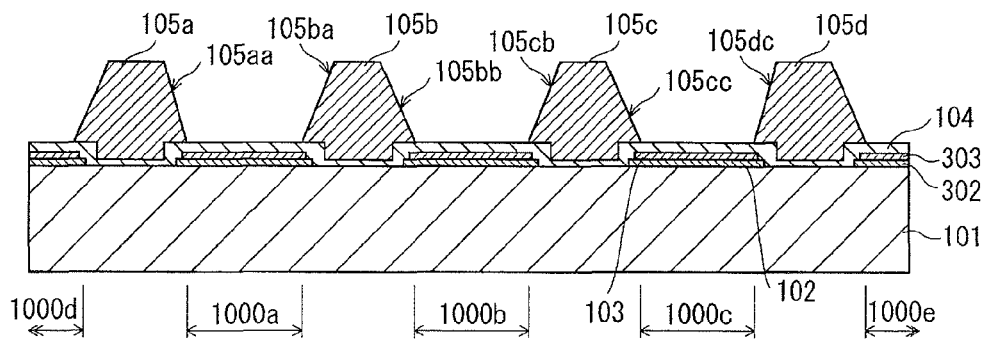
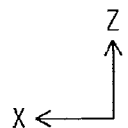

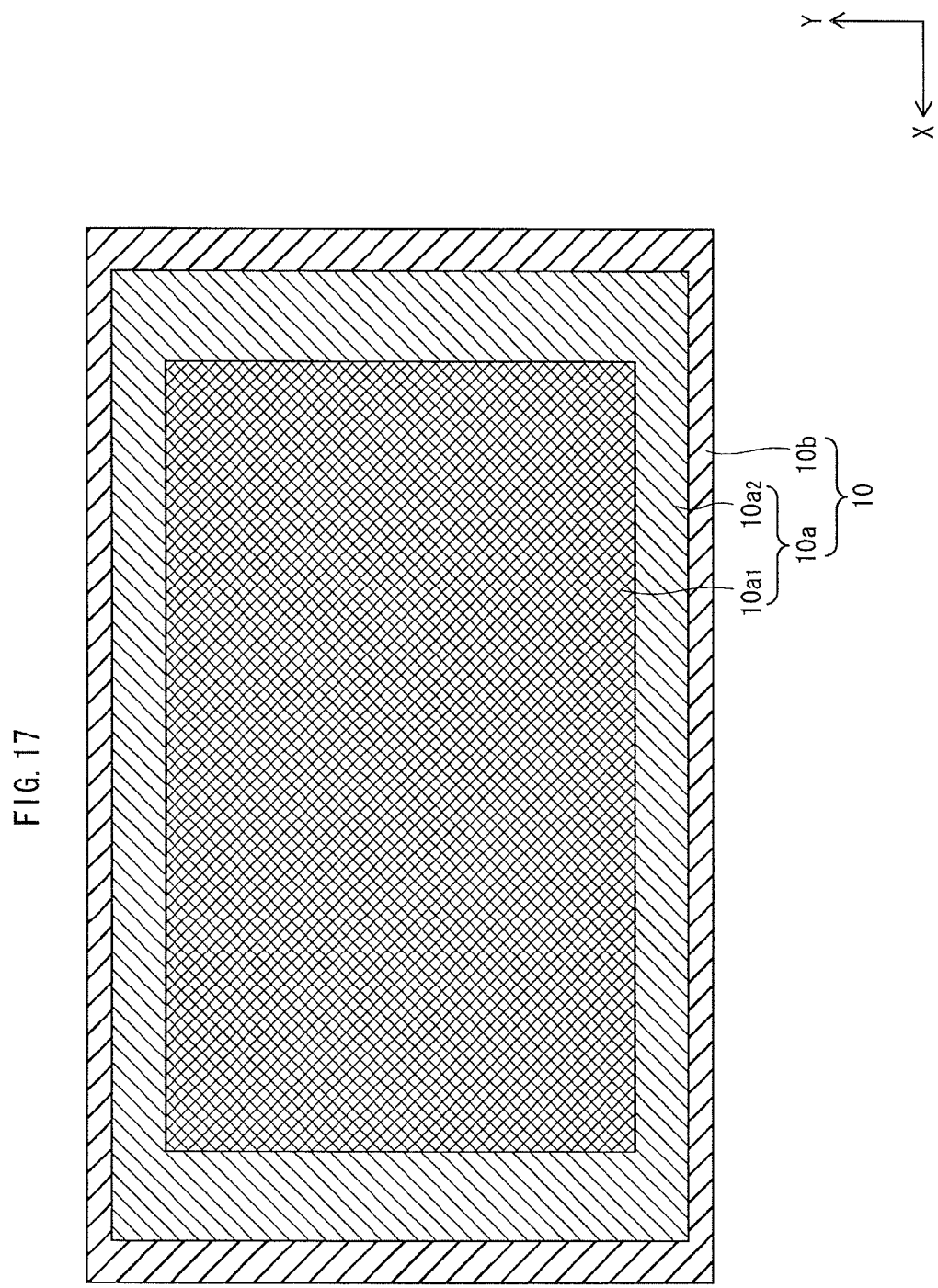

ORGANIC LIGHT-EMITTING PANEL FOR CONTROLLING AN ORGANIC LIGHT EMITTING LAYER THICKNESS AND ORGANIC DISPLAY DEVICE

This is a continuation application of PCT Application No. PCT/JP2010/006149 filed on Oct. 15, 2010, designating the United States of America, the disclosure of which, including the specification, drawings and claims, is incorporated herein by reference in its entirety.

TECHNICAL FIELD

The present invention relates an organic light-emitting panel, a manufacturing method thereof, and an organic display device.

BACKGROUND ART

In recent years, progress has been made in the research and development of display devices that use the phenomenon of electroluminescence occurring in organic material. Each light-emitting cell of such a display device is composed of an anode and a cathode with an organic light-emitting layer therebetween. When the display device is driven, holes are injected through the anode, electrons are injected through the cathode, and the holes and electrons recombine within the organic light-emitting layer, thereby emitting the light.

Banks composed of insulating material partition the organic light-emitting layer into light-emitting cells. The organic light-emitting layer is formed by dripping ink, which includes an organic light-emitting material, into each region separated by the banks and drying the ink.

Meanwhile, a problem with the organic light-emitting layer formed in this way is that it is difficult for the layer to have a uniform film thickness.

As one example of technologies for evening out the film thickness of the organic light-emitting layer, Patent Literature 1 discloses providing a convexity on the inner sidewall of the bank in order to control the pinning location of the ink. In other words, according to the technology of Patent Literature 1, the pinning location of the ink dripped in one light-emitting cell can be set to the convexity. With this technology, it is possible to secure a uniform film thickness to a certain degree.

CITATION LIST

Patent Literature

Patent Literature 1: Japanese Patent Application Publication No. 2007-311235

SUMMARY OF INVENTION

Technical Problem

It is considered difficult, however, to use the technology of Patent Literature 1 to detect in advance how the organic light-emitting layer of a display device is uneven in film thickness and, based on the detection results, form a minute convexity for each region or each inner sidewall of the bank to a high degree of precision. Therefore, it is not easy to maintain the organic light-emitting layer at a uniform film thickness over the entire region of the organic light-emitting panel.

It is an object of the present invention to solve the above problems by providing a display device, and a manufacturing method thereof, that has a uniform film thickness in the organic light-emitting layer across the entire panel and has an even luminance within the panel.

Solution to Problem

In order to solve the above problems, an organic light-emitting panel according to an aspect of the present invention has the following structure.

The organic light-emitting panel according to an aspect of the present invention comprises: an array of a plurality of pixels; one or more non-light-emitting cells each being provided between a different pair of adjacent pixels; a plurality of light-emitting cells provided in such a manner that each pixel includes at least three light-emitting cells that are arranged in an alignment and emit light of different colors, the at least three light-emitting cells including a first light-emitting cell located at an end of the alignment, a second light-emitting cell located at a central portion of the alignment, and a third light-emitting cell located at another end of the alignment; an underlying layer formed below the array of the plurality of pixels; a plurality of first electrodes each included in the underlying layer and placed below a different one of the plurality of light-emitting cells; a plurality of organic light-emitting layers each formed in a different one of the plurality of light-emitting cells by applying, for each pixel, at least three types of ink, that contain different organic light-emitting materials corresponding one-to-one to the different colors of light, respectively to the at least three light-emitting cells substantially at a same time; and a second electrode formed to be away from the underlying layer with each organic light-emitting layer therebetween.

The above organic light-emitting panel further comprises a plurality of banks formed above the underlying layer, separating the light-emitting cells, and defining each light-emitting cell, each of the plurality of pixels being structured such that among inner sidewalls facing each other in respective adjacent banks defining the first light-emitting cell and the third light-emitting cell, sidewalls adjacent to non-light-emitting cells have larger inclination angles than sidewalls adjacent to the second light-emitting cell, and inner sidewalls facing each other in two adjacent banks defining the second light-emitting cell have substantially equal inclination angles.

Advantageous Effects of Invention

In the above organic light-emitting panel according to an aspect of the present invention, for each pixel, three types of ink respectively corresponding to the first, second and third light-emitting cells are applied substantially at the same time, and thereby the organic light-emitting cells are formed. In this case, with regard to the second light-emitting cell whose two ends have the same ink vapor concentration, since the ink is applied at the same time to the first and third light-emitting cells that are adjacent to the second light-emitting cell, the organic light-emitting layer in the second light-emitting cell is not likely to become uneven in film thickness. Accordingly, with the above structure where inner sidewalls facing each other in two adjacent banks defining the second light-emitting cell have substantially equal inclination angles, it is possible to prevent the organic light-emitting layer from becoming uneven in film thickness.

On the other hand, with regard to the first light-emitting cell, ink is applied to the second light-emitting cell adjacent to the first light-emitting cell, but not to a non-light-emitting cell adjacent to the first light-emitting cell. Thus an end of the first light-emitting cell on the second light-emitting cell side has a higher ink vapor concentration than the opposite end thereof.

Thus the film thickness of the light-emitting layer tends to be larger at an end on the non-light-emitting cell side than at the end on the second light-emitting cell side. Accordingly, the light-emitting layer therein is likely to become uneven in film thickness.

However, in the above organic light-emitting panel according to an aspect of the present invention, among inner sidewalls facing each other in two adjacent banks defining the first light-emitting cell, a sidewall adjacent to a non-light-emitting cell has a larger inclination angle than a sidewall adjacent to the second light-emitting cell. With this structure, the pinning location of the ink in the sidewall on the non-light-emitting cell side is relatively higher than the pinning location of the ink in the sidewall on the second light-emitting cell side. This enables the film thickness of the organic light-emitting layer in the first light-emitting cell on the non-light-emitting cell side to be decreased. As a result, it is possible to prevent the organic light-emitting layer in the first light-emitting cell from becoming uneven in film thickness between two ends thereof (an end on the non-light-emitting cell side and an end on the second light-emitting cell side).

Furthermore, similarly to the above relationship between opposite sidewalls of two adjacent banks defining the first light-emitting cell, among inner sidewalls facing each other in two adjacent banks defining the third light-emitting cell, a sidewall adjacent to a non-light-emitting cell has a larger inclination angle than a sidewall adjacent to the second light-emitting cell. With this structure, the pinning location of the ink in the sidewall on the non-light-emitting cell side is relatively higher than the pinning location of the ink in the sidewall on the second light-emitting cell side. This enables the film thickness of the organic light-emitting layer in the first light-emitting cell on the non-light-emitting cell side to be decreased. As a result, it is possible to prevent the organic light-emitting layer in the third light-emitting cell from becoming uneven in film thickness between two ends thereof (an end on the non-light-emitting cell side and an end on the second light-emitting cell side).

As described above, in the above organic light-emitting panel according to an aspect of the present invention, it is possible to prevent the organic light-emitting layer in each light-emitting cell from becoming uneven in film thickness between two opposite ends thereof, providing excellent light-emitting characteristics in the same pixel.

BRIEF DESCRIPTION OF DRAWINGS

FIG. 6 summarizes the relationship between the inclination angle of the bank sidewall (taper angle) θ, the pinning height H, and the film thickness T of the organic light-emitting layer.

FIGS. 9A, 9B, and 9C are schematic cross-sectional views showing, in order, the main processes in the manufacturing method of the display panel 10.

FIGS. 10A and 10B are schematic cross-sectional views showing, in order, the main processes in the manufacturing method of the display panel 10.

FIGS. 13A and 13B are schematic cross-sectional views showing the main processes in the manufacturing method of Modification 2.

FIGS. 14A and 14B are schematic cross-sectional views showing the main processes in the manufacturing method of Modification 2.

FIG. 17 is a schematic plan view showing regions 10a1, 10a2 and 10b in the display panel 10.

DESCRIPTION OF EMBODIMENTS

[Outline of Aspects of Present Invention]

Figure 1:
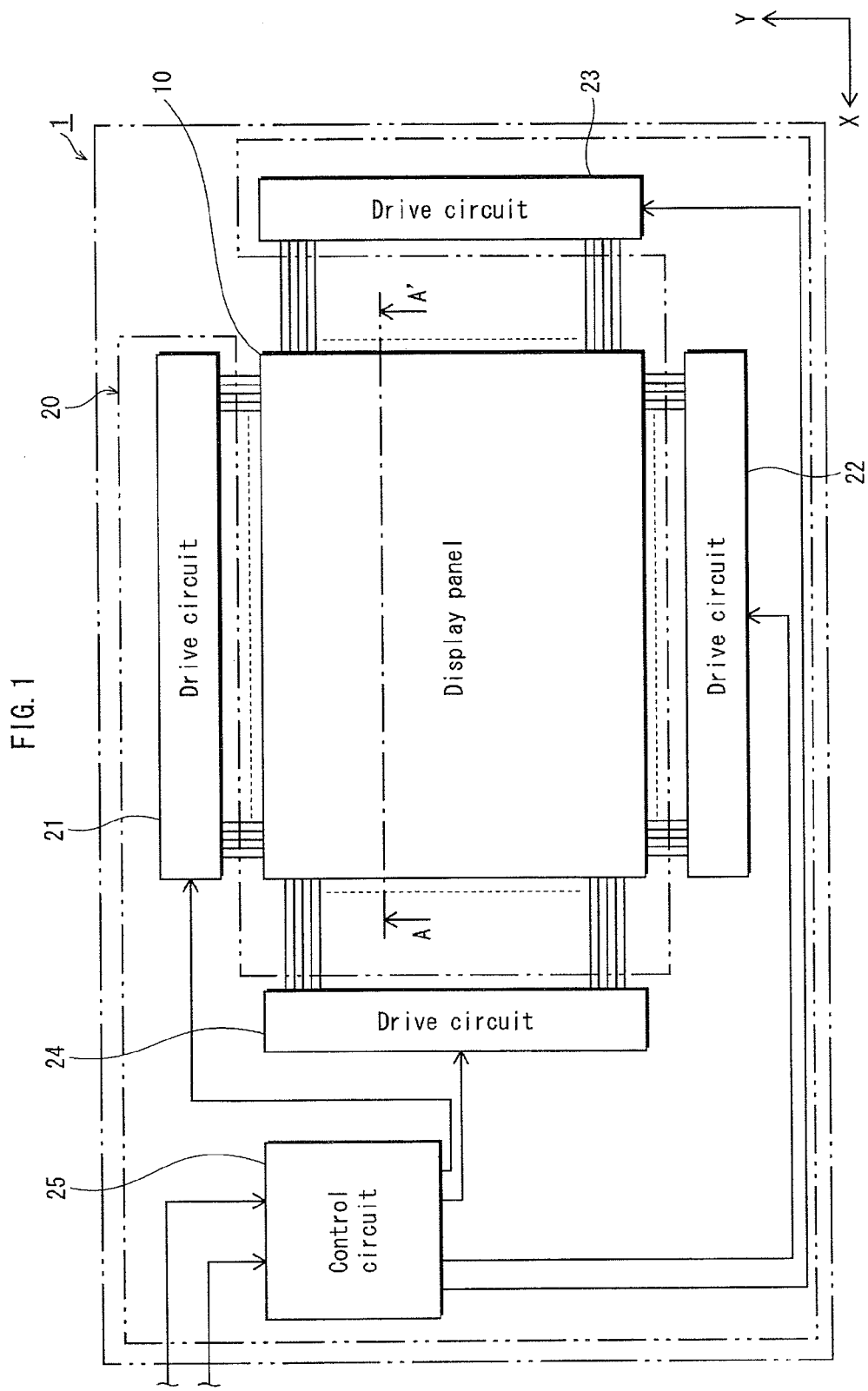
FIG. 1 is a block diagram showing the configuration of an organic display device 1 according to the Embodiment of the present invention.

The organic light-emitting panel according to an aspect of the present invention comprises: an array of a plurality of pixels; one or more non-light-emitting cells each being provided between a different pair of adjacent pixels; a plurality of light-emitting cells provided in such a manner that each pixel includes at least three light-emitting cells that are arranged in an alignment and emit light of different colors, the at least three light-emitting cells including a first light-emitting cell located at an end of the alignment, a second light-emitting cell located at a central portion of the alignment, and a third light-emitting cell located at another end of the alignment; an underlying layer formed below the array of the plurality of pixels; a plurality of first electrodes each included in the underlying layer and placed below a different one of the plurality of light-emitting cells; a plurality of organic light-emitting layers each formed in a different one of the plurality of light-emitting cells by applying, for each pixel, at least three types of ink, that contain different organic light-emitting materials corresponding one-to-one to the different colors of light, respectively to the at least three light-emitting cells substantially at a same time; and a second electrode formed to be away from the underlying layer with each organic light-emitting layer therebetween.

The above organic light-emitting panel further comprises a plurality of banks formed above the underlying layer, separating the light-emitting cells, and defining each light-emitting cell, each of the plurality of pixels being structured such that among inner sidewalls facing each other in respective adjacent banks defining the first light-emitting cell and the third light-emitting cell, sidewalls adjacent to non-light-emitting cells have larger inclination angles than sidewalls adjacent to the second light-emitting cell, and inner sidewalls facing each other in two adjacent banks defining the second light-emitting cell have substantially equal inclination angles.

In the above organic light-emitting panel according to an aspect of the present invention, for each pixel, three types of ink respectively corresponding to the first, second and third light-emitting cells are applied substantially at the same time, and thereby the organic light-emitting cells are formed. In this case, with regard to the second light-emitting cell whose two ends have the same ink vapor concentration, since the ink is applied at the same time to the first and third light-emitting cells that are adjacent to the second light-emitting cell, the organic light-emitting layer in the second light-emitting cell is not likely to become uneven in film thickness. Accordingly, with the above structure where inner sidewalls facing each other in two adjacent banks defining the second light-emitting cell have substantially equal inclination angles, it is possible to prevent the organic light-emitting layer from becoming uneven in film thickness.

On the other hand, with regard to the first light-emitting cell, ink is applied to the second light-emitting cell adjacent to the first light-emitting cell, but not to a non-light-emitting cell adjacent to the first light-emitting cell. Thus an end of the first light-emitting cell on the second light-emitting cell side has a higher ink vapor concentration than the opposite end thereof. Thus the film thickness of the light-emitting layer tends to be larger at an end on the non-light-emitting cell side than at the end on the second light-emitting cell side. Accordingly, the light-emitting layer therein is likely to become uneven in film thickness.

However, in the above organic light-emitting panel according to an aspect of the present invention, among inner sidewalls facing each other in two adjacent banks defining the first light-emitting cell, a sidewall adjacent to a non-light-emitting cell has a larger inclination angle than a sidewall adjacent to the second light-emitting cell. With this structure, the pinning location of the ink in the sidewall on the non-light-emitting cell side is relatively higher than the pinning location of the ink in the sidewall on the second light-emitting cell side. This enables the film thickness of the organic light-emitting layer in the first light-emitting cell on the non-light-emitting cell side to be decreased. As a result, it is possible to prevent the organic light-emitting layer in the first light-emitting cell from becoming uneven in film thickness between two ends thereof (an end on the non-light-emitting cell side and an end on the second light-emitting cell side).

Furthermore, similarly to the above relationship between opposite sidewalls of two adjacent banks defining the first light-emitting cell, among inner sidewalls facing each other in two adjacent banks defining the third light-emitting cell, a sidewall adjacent to a non-light-emitting cell has a larger inclination angle than a sidewall adjacent to the second light-emitting cell. With this structure, the pinning location of the ink in the sidewall on the non-light-emitting cell side is relatively higher than the pinning location of the ink in the sidewall on the second light-emitting cell side. This enables the film thickness of the organic light-emitting layer in the first light-emitting cell on the non-light-emitting cell side to be decreased. As a result, it is possible to prevent the organic light-emitting layer in the third light-emitting cell from becoming uneven in film thickness between two ends thereof (an end on the non-light-emitting cell side and an end on the second light-emitting cell side).

As described above, in the above organic light-emitting panel according to an aspect of the present invention, it is possible to prevent the organic light-emitting layer in each light-emitting cell from becoming uneven in film thickness between two opposite ends thereof, providing excellent light-emitting characteristics in the same pixel.

In the above organic light-emitting panel according to an aspect of the present invention, each of the one or more non-light-emitting cells may include none of the organic light-emitting layers, may include a third electrode made of a same material as a material of the first electrodes, may be placed below the second electrode, and may electrically connect the third electrode with the second electrode.

In the organic light-emitting panel, it is general that the second electrode, which is located at an upper position (on the light extraction side) than the organic light-emitting layer, is made of a light-transmissive material (for example, ITO or IZO). However, these materials exhibit a high electrical resistance. In view of this, each non-light-emitting cell electrically connects the third electrode with the second electrode to decrease the electrical resistance, thereby securing excellent light-emitting characteristics and preventing a voltage drop even when the panel has a large size. The third electrode is, for example, a bus bar.

In the above organic light-emitting panel according to an aspect of the present invention, the sidewall adjacent to a non-light-emitting cell among inner sidewalls facing each other in two adjacent banks defining the first light-emitting cell and the sidewall adjacent to a non-light-emitting cell among inner sidewalls facing each other in two adjacent banks defining the third light-emitting cell may have substantially equal inclination angles.

In the above organic light-emitting panel according to an aspect of the present invention, each non-light-emitting cell is provided between adjacent pixels, and ink for forming the organic light-emitting cells is applied to the first, second and third light-emitting cells substantially at a same time, for each pixel. In this case, an end of the first light-emitting cell on the non-light-emitting cell side and an end of the third light-emitting cell on the non-light-emitting cell side have substantially the same ink vapor concentration. In this case, when the panel is structured as described above, namely, the sidewall adjacent to a non-light-emitting cell among inner sidewalls facing each other in two adjacent banks defining the first light-emitting cell and the sidewall adjacent to a non-light-emitting cell among inner sidewalls facing each other in two adjacent banks defining the third light-emitting cell have substantially equal inclination angles, the pinning locations of the ink in these sidewalls can be set to the same level.

Therefore, with the above structure, it is possible to prevent the organic light-emitting layers in the first, second and third light-emitting cells in each pixel from becoming uneven in film thickness, providing excellent light-emitting characteristics.

In the above organic light-emitting panel according to an aspect of the present invention, the sidewall adjacent to the second light-emitting cell among inner sidewalls facing each other in two adjacent banks defining the first light-emitting cell and the inner sidewalls facing each other in the adjacent banks defining the second light-emitting cell may have substantially equal inclination angles.

In the above organic light-emitting panel according to an aspect of the present invention, each non-light-emitting cell is provided between adjacent pixels, and ink for forming the organic light-emitting cells is applied to the first, second and third light-emitting cells substantially at a same time, for each pixel. In this case, an end of the first light-emitting cell on the second light-emitting cell side and ends of the second light-emitting cell on the first and third light-emitting cell sides have substantially the same ink vapor concentration.

In this case, when the panel is structured as described above, namely, the sidewall adjacent to the second light-emitting cell among inner sidewalls facing each other in two adjacent banks defining the first light-emitting cell and the inner sidewalls facing each other in the adjacent banks defining the second light-emitting cell have substantially equal inclination angles, the pinning locations of the ink in these sidewalls can be set to the same level. Accordingly, with the above structure, it is possible to prevent the organic light-emitting layers in the first, second and third light-emitting cells in each pixel from becoming uneven in film thickness, providing excellent light-emitting characteristics.

In the above organic light-emitting panel according to an aspect of the present invention, the sidewall adjacent to the second light-emitting cell among inner sidewalls facing each other in two adjacent banks defining the third light-emitting cell and the inner sidewalls facing each other in the adjacent banks defining the second light-emitting cell may have substantially equal inclination angles.

In the above organic light-emitting panel according to an aspect of the present invention, each non-light-emitting cell is provided between adjacent pixels, and ink for forming the organic light-emitting cells is applied to the first, second and third light-emitting cells substantially at a same time, for each pixel. In this case, an end of the third light-emitting cell on the second light-emitting cell side and ends of the second light-emitting cell on the first and third light-emitting cell sides have substantially the same ink vapor concentration.

In this case, when the panel is structured as described above, namely, the sidewall adjacent to the second light-emitting cell among inner sidewalls facing each other in two adjacent banks defining the third light-emitting cell and the inner sidewalls facing each other in the adjacent banks defining the second light-emitting cell have substantially equal inclination angles, the pinning locations of the ink in these sidewalls can be set to the same level. Accordingly, with the above structure, it is possible to prevent the organic light-emitting layers in the first, second and third light-emitting cells in each pixel from becoming uneven in film thickness, providing excellent light-emitting characteristics.

In the above organic light-emitting panel according to an aspect of the present invention, the inclination angles of the sidewalls of the banks can be set to the following ranges.

(a1) an inclination angle of the sidewall adjacent to a non-light-emitting cell among inner sidewalls facing each other in two adjacent banks defining the first light-emitting cell is in a range from 35 degrees to 45 degrees inclusive, (a2) an inclination angle of the sidewall adjacent to a non-light-emitting cell among inner sidewalls facing each other in two adjacent banks defining the third light-emitting cell is in a range from 35 degrees to 45 degrees inclusive, (a3) an inclination angle of the sidewall adjacent to the second light-emitting cell among inner sidewalls facing each other in two adjacent banks defining the first light-emitting cell is in a range from 25 degrees to 35 degrees inclusive, (a4) an inclination angle of the sidewall adjacent to a non-light-emitting cell among inner sidewalls facing each other in two adjacent banks defining the third light-emitting cell is in a range from 25 degrees to 35 degrees inclusive, and (a5) inclination angles of the inner sidewalls facing each other in two adjacent banks defining the second light-emitting cell are in a range from 25 degrees to 35 degrees inclusive.

In the above organic light-emitting panel according to an aspect of the present invention, each inclination angle may be formed between each of inner sidewalls facing each other in adjacent banks and an upper surface of the underlying layer (which corresponds to the first electrode, hole injection layer, or hole injection transporting layer).

An organic display device according to another aspect of the present invention includes any one of the above organic light-emitting panels according to an aspect of the present invention. Therefore, the organic display device according to another aspect of the present invention produces the advantageous effect that is provided by the organic light-emitting panel according to an aspect of the present invention, that is to say, the advantageous effect of preventing the organic light-emitting layer from becoming uneven in film thickness and providing excellent light-emitting characteristics.

A manufacturing method of an organic light-emitting panel according to a further aspect of the present invention is a manufacturing method of an organic light-emitting panel including an array of a plurality of pixels and one or more non-light-emitting cells that are each provided between a different pair of adjacent pixels, and the manufacturing method comprises the following steps.

(first step) forming, on a substrate, an underlying layer including a plurality of first electrodes;

(second step) layering a photoresist material on the underlying layer;

(third step) forming, for each pixel, a plurality of openings corresponding to a plurality of light-emitting cells and one or more openings corresponding to the non-light-emitting cells by performing an exposure with a mask laid on the layered photoresist material to form a pattern, and forming a plurality of banks to separate the light-emitting cells and the non-light-emitting cells and define each light-emitting cell and each non-light-emitting cell;

(fourth step) forming a plurality of organic light-emitting layers by dripping ink that includes organic light-emitting materials into the plurality of openings corresponding to the plurality of light-emitting cells, and drying the ink; and (fifth step) forming a second electrode above each organic light-emitting layer, In the above manufacturing method of an organic light-emitting panel according to a further aspect of the present invention, in the third step, for each of at least part of the plurality of pixels to be formed, a first opening corresponding to a first light-emitting cell located at an end of an alignment in which the light-emitting cells are to be formed, a second opening corresponding to a second light-emitting cell located at a central portion of the alignment, and a third opening corresponding to a third light-emitting cell located at another end of the alignment, are formed, further each of the plurality of pixels is formed such that among inner sidewalls facing each other in respective adjacent banks defining the first light-emitting cell and the third light-emitting cell, sidewalls adjacent to non-light-emitting cells have larger inclination angles than sidewalls adjacent to the second light-emitting cell, and inner sidewalls facing each other in two adjacent banks defining the second light-emitting cell have substantially equal inclination angles, and in the fourth step, the organic light-emitting layers are formed by dripping, for each pixel, three types of ink corresponding one-to-one to three colors of light into the first opening, the second opening and the third opening substantially at a same time.

With adoption of the above manufacturing method, it is possible to set the pinning locations of the ink applied in the fourth step to be higher in the sidewalls adjacent to non-light-emitting cells than the other sidewalls, among inner sidewalls facing each other in respective adjacent banks defining the first light-emitting cell and the third light-emitting cell.

The above manufacturing method of an organic light-emitting panel according to a further aspect of the present invention can prevent the organic light-emitting layers from becoming uneven in film thickness based on the mechanism that, after the ink is dried, the larger the inclination angle of a sidewall of a bank is, the smaller the film thickness of the organic light-emitting layer near the sidewall is. Thus the manufacturing method makes it possible to manufacture an organic light-emitting panel having excellent light-emitting characteristics.

In the above manufacturing method according to an aspect of the present invention, in the third step, when the exposure of the photoresist material is performed, an inclination angle of the sidewall adjacent to a non-light-emitting cell among inner sidewalls facing each other in two adjacent banks defining the first light-emitting cell may be made larger than an inclination angle of the sidewall adjacent to the second light-emitting cell among the inner sidewalls facing each other in the two adjacent banks defining the first light-emitting cell, by causing a part of the photoresist material corresponding to the sidewall adjacent to the non-light-emitting cell to be exposed to a larger amount of light than a part of the photoresist material corresponding to the sidewall adjacent to the second light-emitting cell, and an inclination angle of the sidewall adjacent to a non-light-emitting cell among inner sidewalls facing each other in two adjacent banks defining the third light-emitting cell may be made larger than an inclination angle of the sidewall adjacent to the second light-emitting cell among the inner sidewalls facing each other in the two adjacent banks defining the third light-emitting cell, by causing a part of the photoresist material corresponding to the sidewall adjacent to the non-light-emitting cell to be exposed to a larger amount of light than a part of the photoresist material corresponding to the sidewall adjacent to the second light-emitting cell.

With the above manufacturing method, the relative relationship among the pinning locations is adjusted, which makes it possible to prevent the organic light-emitting layers from becoming uneven in film thickness in all the light-emitting cells, and manufacture an organic light-emitting panel having excellent light-emitting characteristics.

In the above manufacturing method according to a further aspect of the present invention, in the third step, when the exposure of the photoresist material is performed, an inclination angle of the sidewall adjacent to a non-light-emitting cell among inner sidewalls facing each other in two adjacent banks defining the first light-emitting cell may be made larger than an inclination angle of the sidewall adjacent to the second light-emitting cell among the inner sidewalls facing each other in the two adjacent banks defining the first light-emitting cell, by using different masks for respective parts of the photoresist material corresponding to the two sidewalls so that a light transmissivity at a part of the photoresist material corresponding to the sidewall adjacent to the non-light-emitting cell is lower than a light transmissivity at a part of the photoresist material corresponding to the sidewall adjacent to the second light-emitting cell, and an inclination angle of the sidewall adjacent to a non-light-emitting cell among inner sidewalls facing each other in two adjacent banks defining the third light-emitting cell may be made larger than an inclination angle of the sidewall adjacent to the second light-emitting cell among the inner sidewalls facing each other in the two adjacent banks defining the third light-emitting cell, by using different masks for respective parts of the photoresist material corresponding to the two sidewalls so that a light transmissivity at a part of the photoresist material corresponding to the sidewall adjacent to the non-light-emitting cell is lower than a light transmissivity at a part of the photoresist material corresponding to the sidewall adjacent to the second light-emitting cell.

With the above manufacturing method, the relative relationship among the pinning locations is adjusted, which makes it possible to prevent the organic light-emitting layers from becoming uneven in film thickness in all the light-emitting cells, and manufacture an organic light-emitting panel having excellent light-emitting characteristics.

In the above manufacturing method according to a further aspect of the present invention, in the third step, after the photoresist material is exposed and developed, an inclination angle of the sidewall adjacent to a non-light-emitting cell among inner sidewalls facing each other in two adjacent banks defining the first light-emitting cell may be made larger than an inclination angle of the sidewall adjacent to the second light-emitting cell among the inner sidewalls facing each other in the two adjacent banks defining the first light-emitting cell, by additionally performing an exposure process onto a part of the photoresist material corresponding to the sidewall adjacent to the non-light-emitting cell, and an inclination angle of the sidewall adjacent to a non-light-emitting cell among inner sidewalls facing each other in two adjacent banks defining the third light-emitting cell may be made larger than an inclination angle of the sidewall adjacent to the second light-emitting cell among the inner sidewalls facing each other in the two adjacent banks defining the third light-emitting cell, by additionally performing an exposure process onto a part of the photoresist material corresponding to the sidewall adjacent to the non-light-emitting cell.

With the above manufacturing method, the relative relationship among the pinning locations is adjusted, which makes it possible to prevent the organic light-emitting layers from becoming uneven in film thickness in all the light-emitting cells, and manufacture an organic light-emitting panel having excellent light-emitting characteristics.

An organic display device according to a further aspect of the present invention includes an organic light-emitting panel manufactured by any one of the above manufacturing methods according to another aspect of the present invention.

With the above manufacturing method, the relative relationship among the pinning locations is adjusted, which makes it possible to prevent the organic light-emitting layers from becoming uneven in film thickness in all the light-emitting cells, and manufacture an organic light-emitting panel having excellent light-emitting characteristics.

(Process by Which the Embodiment According to the Present Invention was Achieved)

As a result of intense study, the inventor of the present invention discovered the following with regard to the organic light-emitting panel recited in the Background Art and the organic display device provided with the organic light-emitting panel.

Figure 20:
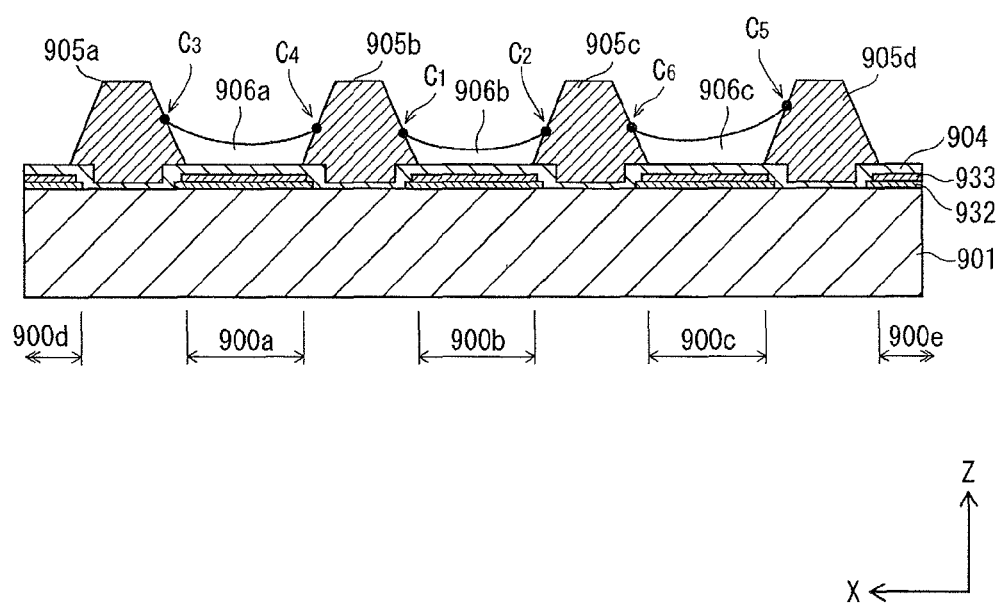
FIG. 20 is a schematic cross-sectional view showing how the film thickness distribution of the organic light-emitting layer is uneven in a series of sub-pixels of the display panel.

Typically, as shown in FIG. 20, an anode 902 and an electrode coating layer 903 covering the anode 902 are formed on a substrate 901, for each of sub-pixels 900a, 900b, and 900c.

A hole injection layer 904 is then formed to cover the entire surface of the electrode coating layer 903 and the substrate 901, and on the hole injection layer 904, organic light-emitting layers 906a, 906b, and 906c of different colors are formed one-to-one in sub-pixels 900a, 900b, and 900c. The organic light-emitting layers 906a, 906b, and 906c are separated from each other by the banks formed to stand on the hole injection layer 904.

Also, in the organic light-emitting panel, for example, a pixel is composed of three sub-pixels 900a, 900b, and 900c, and non-light-emitting cells 900d and 900e are present between the pixel and adjacent pixels on both sides thereof. Each of the non-light-emitting cells 900d and 900e has a bus bar 932 and an electrode coating layer 933 covering the bus bar 932, but does not have an organic light-emitting layer.

As shown in FIG. 20, in an organic light-emitting panel of a conventional technology, an uneven film thickness is observed in the organic light-emitting layers 906a and 906c of the sub-pixels 900a and 900c that are adjacent to the non-light-emitting cells 900d and 900e, respectively. More specifically, the organic light-emitting layer 906a in the sub-pixel 900a becomes higher at a point $C_3$ near the bank 905a than at a point $C_4$ near the bank 905b and also higher than the organic light-emitting layer 906b in the sub-pixel 900b at points $C_1$ and $C_2$ near the banks 905b and 905c. Similarly, the organic light-emitting layer 906c in the sub-pixel 900c becomes higher at a point $C_5$ near the bank 905d than at a point $C_6$ near the bank 905c and also higher than the organic light-emitting layer 906b in the sub-pixel 900b at points $C_1$ and $C_2$ near the banks 905b and 905c.

Figure 21A:
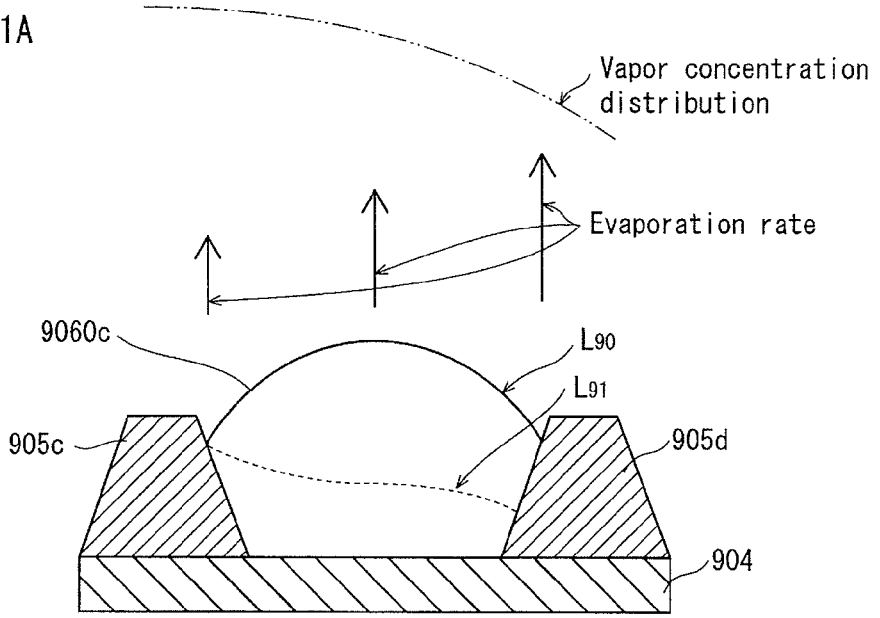
FIGS. 21A, 21B, and 21C are schematic cross-sectional views showing the vapor concentration distribution during formation of the organic light-emitting layer, and unevenness of film shape in the ink drying process.

After repeated examination of the above phenomenon, the inventor assumed that reduction in uniformity of film thickness in the organic light-emitting layer is caused by a non-uniform vapor concentration distribution during ink drying, as described in the following. That is to say, as shown in FIG. 21A, suppose a state in which ink 9060c for forming the organic light-emitting layer has been applied in an area between the bank 905c and the bank 905d, and the right-hand side of FIG. 21A is lower than the left-hand side in vapor concentration distribution as indicated by the two dot chain line. In this case, the film thickness in the organic light-emitting layer becomes uneven for the following reasons.

As shown in FIG. 21A, a surface profile $L_{90}$ of ink 9060c has been swollen up at the center of the sub-pixel immediately after the ink is dripped. When drying the ink, due to the non-uniform vapor concentration distribution as mentioned above, the evaporation rate varies in reverse proportion to the vapor concentration, and therefore it can be theoretically considered that the ink changes to have a surface profile $L_{91}$.

Figure 21B:
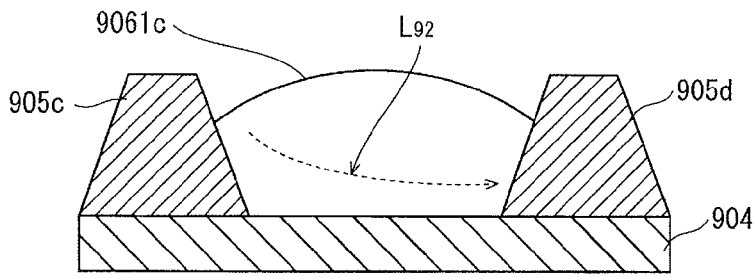
Figure 21C:
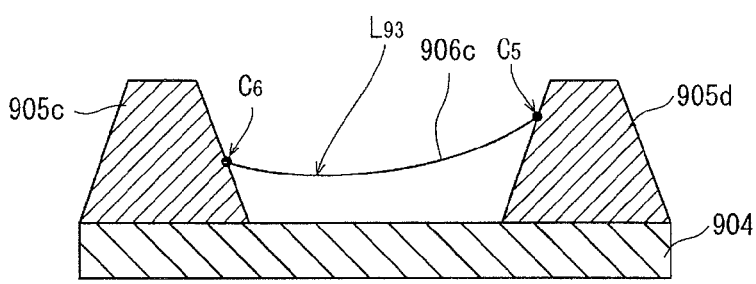

However, as shown in FIG. 21B, solvent in the ink 9061c flows during drying as shown by the dotted arrow $L_{92}$. This is because solvent flows to compensate for solvent that has evaporated (i.e. flows to minimize surface free energy), and along with the flow of the solvent, the solute (organic light-emitting material) also flows. Therefore, as shown in FIG. 21C, if the vapor concentration distribution is not uniform, the organic light-emitting layer 906c is formed to have a surface profile $L_{93}$ in which the closer to the bank 905d the layer is, the higher the layer is (i.e. the layer is higher at the point $C_5$ than at the point $C_6$).

The inventor therefore deduced that, in an organic light-emitting panel, the film thickness of the organic light-emitting layer decreases in uniformity due to non-uniformity of vapor concentration distribution during ink drying.

This led the inventor to reach a technical feature in which the bank sidewalls are made to have different inclination angles so that the bank sidewalls have different pinning locations, resulting in a uniform film thickness of the organic light-emitting layer.

Embodiment

The following describes an example of an embodiment of the present invention with reference to the drawings.

Note that the following Embodiment is simply an example to clearly illustrate a structure of the present invention and the acts and effects thereof. The present invention is in no way limited to the following Embodiment except in its essential characteristic elements.

1. Configuration of Display Device 1

The overall structure of the display device 1 according to the present Embodiment is described with reference to FIG. 1.

As shown in FIG. 1, the display device (organic display device) 1 includes a display panel unit 10 and a drive control unit 20 connected to the display panel unit 10. The display panel unit 10 is an organic light-emitting panel that uses the phenomenon of electroluminescence occurring in organic material and is composed of a plurality of pixels arrayed two-dimensionally in the X-Y plane direction.

The drive control unit 20 is composed of four drive circuits 21-24 and a control circuit 25.

Note that in an actual display device 1, the placement of the drive control unit 20 with respect to the display panel unit 10 is not limited in this way.

2. Structure of Display Panel 10

Figure 2:
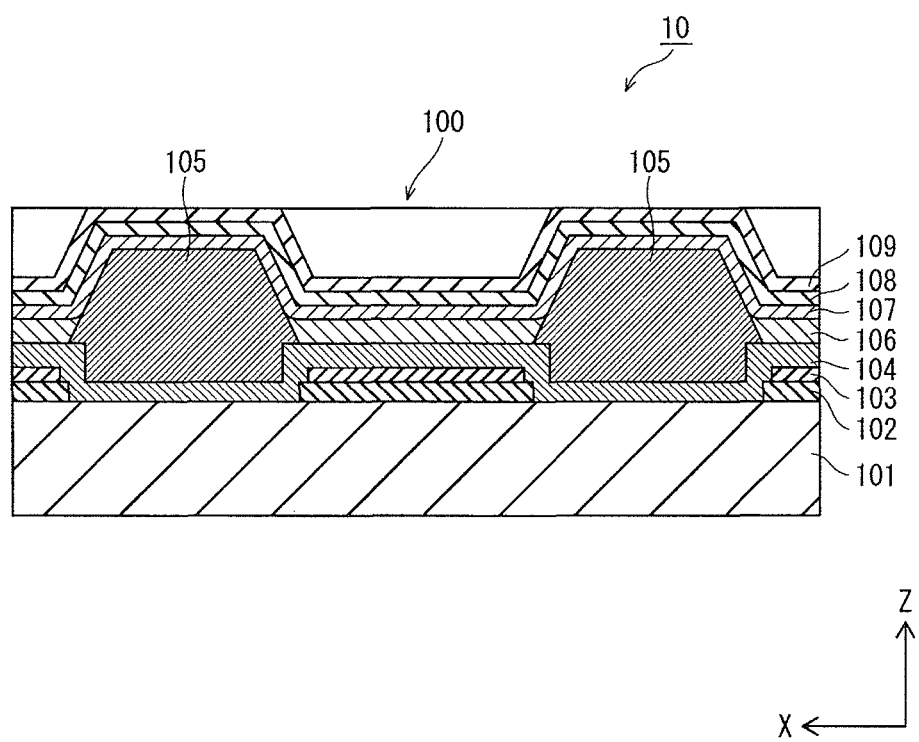
FIG. 2 is a schematic cross-sectional view showing a sub-pixel 100 included in a display panel 10.

The structure of the display panel 10 is described with reference to FIG. 2. Note that, as an example, the display panel 10 in the present Embodiment is a top emission type organic light-emitting panel including a plurality of pixels arranged in a matrix, each pixel including sub-pixels that are each provided with an organic light-emitting layer having a luminescent color of either red (R), green (G), or blue (B). FIG. 2 depicts one sub-pixel 100 in a pixel.

As shown in FIG. 2, in the display panel 10, an anode 102 is formed above a TFT substrate (hereinafter simply referred to as a "substrate") 101, and an electrode coating layer 103 and hole injection transporting layer 104 are layered above the anode 102 in this order. Note that the anode 102 and electrode coating layer 103 are formed separately for each sub-pixel 100.

Above the hole injection transporting layer 104, banks 105, made of insulating material, are provided to stand to separate the sub-pixels 100 from each other. An organic light-emitting layer 106 is formed in the region in each sub-pixel 100 separated by the banks 105, and an electron injection layer 107, cathode 108, and passivation layer 109 are layered above the organic light-emitting layer 106 in this order.

a) Substrate 101

The substrate 101 is made of a base of an insulating material such as alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc. Although not illustrated, in the substrate 101, a TFT layer, a passivation film, an interlayer insulation film, etc. are laminated.

b) Anode 102

The anode 102 is composed of a single layer or of a laminate of a plurality of layers, either being made of a conductive material, such as aluminum (Al), alloy including Al, silver (Ag), alloy of silver, palladium, and copper (APC), alloy of silver, rubidium, and gold (ARA), alloy of molybdenum and chromium (MoCr), alloy of nickel and chromium (NiCr), etc.

Note that in the case of a top emission type panel such as the panel in the Embodiment, it is preferable that the anode 102 be made of a highly reflective material.

c) Electrode Coating Layer 103

The electrode coating layer 103 is made of, for example, indium tin oxide (ITO) and covers at least a part of the top surface the anode 102 in the Z axis direction.

d) Hole Injection Transporting Layer 104

The hole injection transporting layer 104 is a layer of an oxide such as silver (Ag), molybdenum (Mo), chromium (Cr), vanadium (V), tungsten (W), nickel (Ni), or iridium (Ir), or a conductive polymer material such as PEDOT (Poly(3,4-ethylenedioxythiophene) poly(styrenesulfonate)). A hole injection transporting layer 104 made of a metal oxide among the above materials has the function of assisting with hole generation and of injecting and transporting holes stably into the organic light-emitting layer 106. The hole injection transporting layer 104 has a high work function.

When the hole injection transporting layer 104 is made of an oxide of a transition metal, a plurality of levels can be occupied since there are a plurality of oxidation numbers. This makes hole injection easy and allows for reduction of driving voltage.

e) Banks 105

The banks 105 are made of an organic material such as resin and have insulating properties. Examples of the organic material used to form the banks 105 include acrylic resin, polyimide resin, novolac-type phenolic resin, etc. It is also preferable that the banks 105 have organic solvent resistance.

Furthermore, since the banks 105 are etched and baked when formed, it is preferable that the banks be made of a highly resistant material that will not change in shape or quality during the etching and baking processes. To provide the banks with liquid repellency, the sidewalls can be fluoridated.

Note that as the insulating material used in forming the banks 105, any liquid repellent material with a resistivity of $10^5$ Ω·cm can be used, starting with the above materials. Using a material with a resistivity of less than $10^5$ Ω·cm leads to production of leak current between the anode 102 and the cathode 108, or between adjacent sub-pixels 100, which causes a variety of problems such as increased power consumption.

Furthermore, if a hydrophilic material is used to form the banks 105, the difference in affinity/liquid repellency between the sidewall of the banks 105 and the surface of the hole injection transporting layer 104 becomes small, and it thus becomes difficult to selectively maintain the ink, which includes an organic substance for forming the organic light-emitting layer 106, at the opening of the banks 105.

The structure of the banks 105 need not be a single layer as shown in FIG. 2, but may adopt a multi-layered structure composed of two or more layers. In such a case, the above materials may be combined for each layer, or layers may alternate between non-organic and organic material.

f) Organic Light-Emitting Layer 106

The organic light-emitting layer 106 has a function to emit light when an excitation state is produced by the recombination of holes injected through the anode 102 with electrons injected through the cathode 108. The material used to form the organic light-emitting layer 106 needs to be a light-emitting organic material, a film of which can be formed by wet printing.

More specifically, it is preferable that the organic light-emitting layer 106 be made of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

g) Electron Injection Layer 107

The electron injection layer 107 has a function to transport electrons injected through the cathode 108 to the organic light-emitting layer 106 and is preferably made of, for example, barium, phthalocyanine, lithium fluoride, or a combination thereof.

h) Cathode 108

The cathode 108 is made of, for example, ITO, indium zinc oxide (IZO), etc. When the display panel 10 is a top-emission type, it is preferable that the cathode 108 be made of a light-transmissive material. It is preferable that the light transmissivity be 80% or greater.

The material used to form the cathode 108 may be, in addition to the above materials, for example, an alkali metal, alkali earth metal, or a laminate structure having, in the following order, a layer that includes a halide of an alkali metal or alkali earth metal and a layer that includes silver. The layer that includes silver may be made of silver alone, or from a silver alloy. Also, in order to increase light extraction efficiency, a highly-transparent refraction index adjustment layer may be provided above the layer that includes silver.

i) Passivation Layer 109

The passivation layer 109 has a function to control the organic light-emitting layer 106 or other layers from being exposed to water or air and is made of, for example, silicon nitride (SiN), silicon oxynitride (SiON) etc. When the display panel 10 is a top-emission type, it is preferable that the passivation layer 109 be made of a light-transmissive material.

3. Structure of Banks 105

Figure 3:
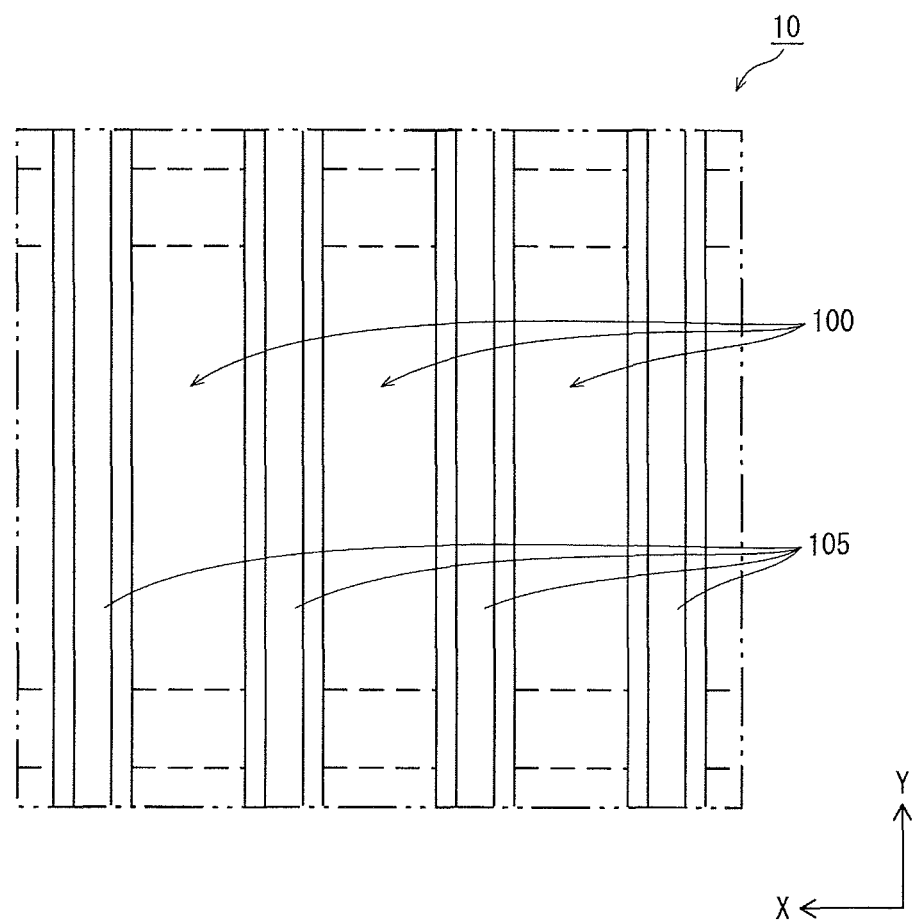
FIG. 3 is a schematic plan view showing a bank 105 in the display panel 10.

As shown in FIG. 3, in the display panel 10 of the present Embodiment, the banks 105 are arranged in lines, as one example. More specifically, the banks 105 each extend along the Y axis and separate the adjacent sub-pixels 100 in the X axis direction. The sub-pixels 100 are formed so that each of the regions separated by the banks 105 in each pixel emits a different color. For example, one pixel is composed of three sub-pixels that emit light of red (R), green (G), and blue (B), respectively.

4. Structure of Banks 105 in Each Region

The structure of the banks 105 in each region is described with reference to FIG. 4. Note that FIG. 4 is a schematic cross-sectional view taken along line A-A' passing through the display panel 10 in FIG. 1, and schematically illustrating some parts thereof.

Figure 4:
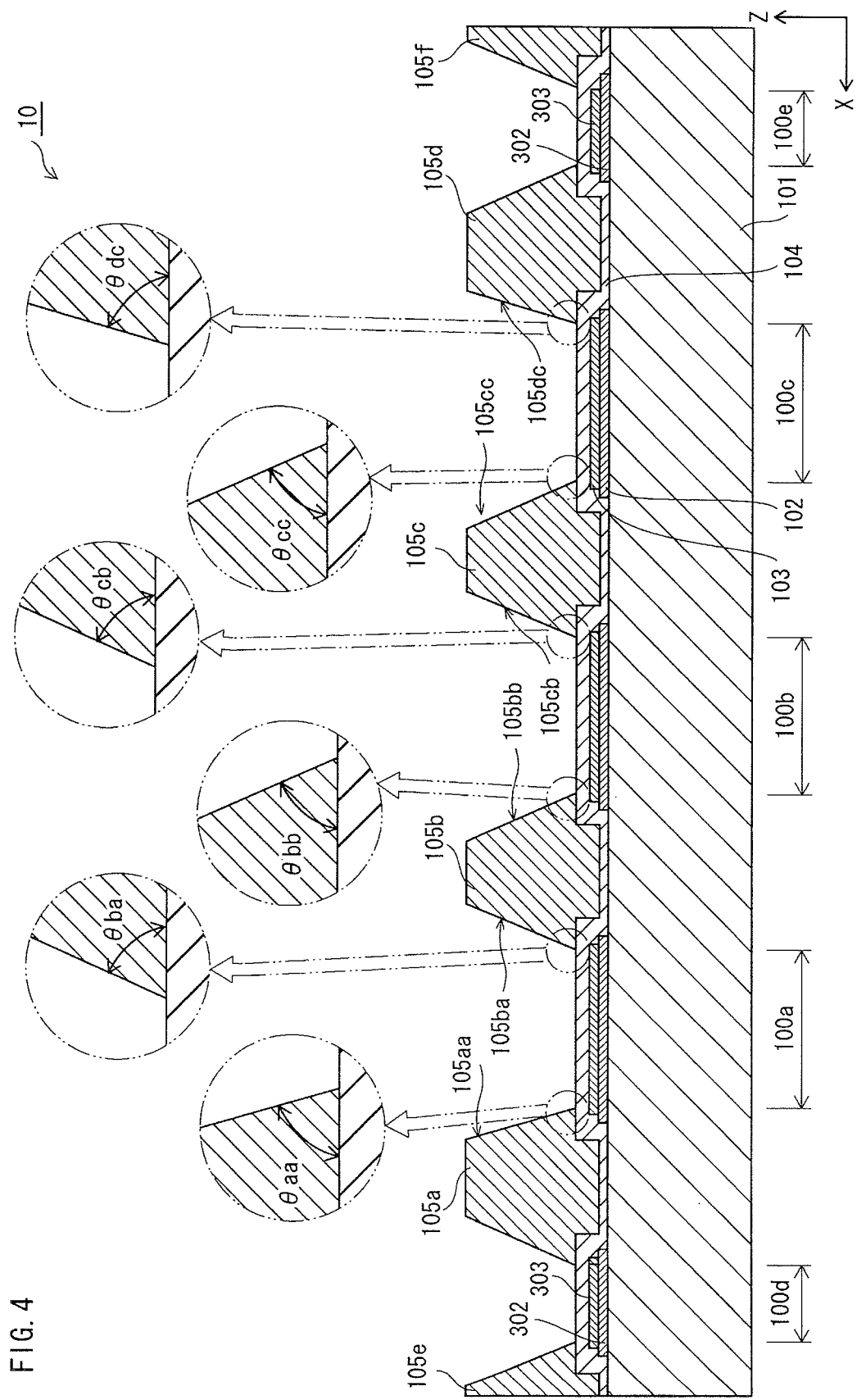
FIG. 4 is a schematic cross-sectional view showing the structure of sub-pixels 100a to 100c included in the display panel 10 and banks 105a to 105d defining the sub-pixels 100a to 100c.

As shown in FIG. 4, in the display panel 10, an anode 102 is formed on a TFT substrate (hereinafter simply referred to as a "substrate") 101 for each of sub-pixels 100a, 100b, and 100c, and an electrode coating layer 103 and hole injection transporting layer 104 are layered on the anode 102 in this order.

Above the hole injection transporting layer 104, banks 105a, 105b, 105c, and 105d made of an insulating material are provided to stand to separate the sub-pixels 100a, 100b, and 100c. Note that, in each region of the sub-pixels 100a, 100b, and 100c separated by the banks 105a, 105b, 105c, and 105d, an organic light-emitting layer, electron injection layer, cathode, and passivation layer are layered in this order (not illustrated in FIG. 4).

In the display panel 10 of the present Embodiment, one pixel is composed of a set of sub-pixels 100a, 100b, and 100c, and non-light-emitting cells 100d and 100e are provided between the pixel and adjacent pixels on both sides thereof, respectively. The sub-pixel 100a and the non-light-emitting cell 100d are separated from each other by a bank 105a, and the non-light-emitting cell 100d and an adjacent sub-pixel of a pixel that is on the left-hand side in the X axis direction are separated from each other by a bank 105e. The sub-pixel 100c and the non-light-emitting cell 100e are separated from each other by a bank 105d, and the non-light-emitting cell 100e and an adjacent sub-pixel of a pixel that is on the right-hand side in the X axis direction are separated from each other by a bank 105f.

As shown in FIG. 4, in each of the non-light-emitting cells 100d and 100e, an electrode (bus bar) 302 which is made of the same material as the anode 102 is formed, and the electrode coating layer 303 is formed to cover the electrode 302. The hole injection transporting layer 104 is provided to extend over and cover the electrode coating layers 303. Although not illustrated, the cathode is formed above the hole injection transporting layer 104, and the electrode 302 is electrically connected with the cathode 108.

Note that, in the non-light-emitting cells 100d and 100e, no organic light-emitting layer is formed. The above structures help reduce electrical resistance in the cathode 108 made of ITO or the like, thus preventing a voltage drop.

As shown in FIG. 4, in the display panel 10 of the present Embodiment, sidewalls 105aa, 105ba, 105bb, 105cb, 105cc, and 105dc of banks 105a, 105b, 105c and 105d respectively form angles θaa, θba, θbb, θcb, θcc, and θdc with surfaces of the hole injection transporting layers 104, which are referred to as underlying layers here.

In the present Embodiment, the angles θaa, θba, θbb, θcb, θcc, and θdc satisfy the relationships in the following expressions.

$$\theta aa > \theta ba = \theta bb = \theta cb = \theta cc \quad \text{[Expression 1]}$$

$$\theta dc > \theta ba = \theta bb = \theta cb = \theta cc \quad \text{[Expression 2]}$$

Note that in the present Embodiment, the angles θaa, θba, θbb, θcb, θcc, and θdc are preferably be set within the following ranges.

$$25° < \theta ba = \theta bb = \theta cb = \theta cc < 35° \quad \text{[Expression 3]}$$

$$35° < \theta aa < 45° \quad \text{[Expression 4]}$$

$$35° < \theta dc < 45° \quad \text{[Expression 5]}$$

The reason why the inclination angles θaa, θba, θbb, θcb, θcc, and θdc of the sidewalls 105aa, 105ba, 105bb, 105cb, 105cc, and 105dc are set to satisfy the above Expressions 1 to 5 is that the arrangement of the non-light-emitting cells 100d and 100e between adjacent pixels and the ink application form of ink 1060a, 1060b, and 1060c, which will be described later, need to be taken into account.

5. Relationship Between Inclination Angle θ of Sidewall of Banks 105 and Film Thickness of Organic Light-Emitting Layer 106

The relationship between the inclination angles θ of the sidewalls of the banks 105 and the film thickness of the organic light-emitting layer 106 is described with reference to FIGS. 5 and 6. Note that FIG. 5 is a schematic rendering of the structure of a sub-pixel.

Figure 5A:
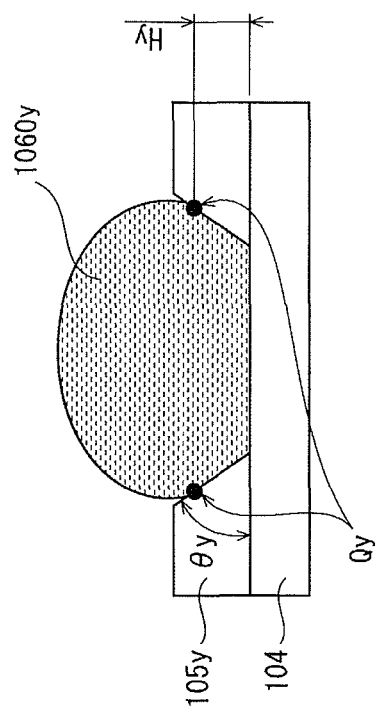
FIG. 5A is a schematic cross-sectional view showing pinning locations when the taper angle of the bank sidewall is small.
Figure 5B:
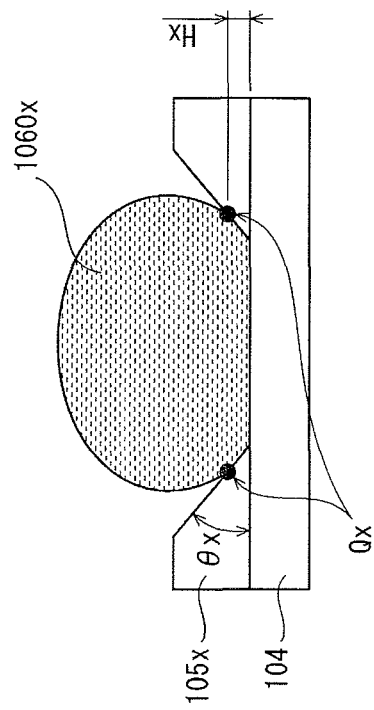
FIG. 5B is a schematic cross-sectional view showing pinning locations when the taper angle of the bank sidewall is large.

As shown in FIG. 5A, the inclination angle of the sidewall of bank 105x (the angle between the sidewall and the surface of the hole injection transporting layer 104) is represented by angle θx, and as shown in FIG. 5B, the inclination angle of the sidewall of bank 105y (the angle between the sidewall and the surface of the hole injection transporting layer 104) is represented by angle θy. Here, the angles θx and θy satisfy the following relationship.

$$\theta y > \theta x \quad \text{[Expression 6]}$$

When ink 1060x and ink 1060y, which include an organic light-emitting material, are each dripped into the openings bounded by the banks 105x and 105y, respectively, the pinning locations Px and Py respectively have heights Hx and Hy that satisfy the following relationship.

$$Hy > Hx \quad \text{[Expression 7]}$$

Figure 5C:
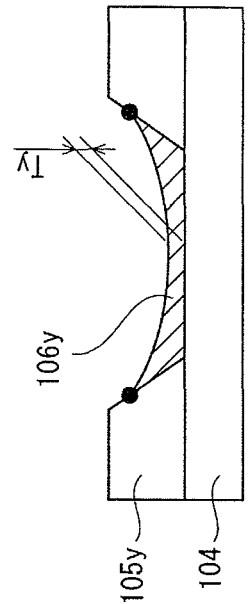
FIG. 5C is a schematic cross-sectional view showing the condition of the organic light-emitting layer after drying when the taper angle of the bank sidewall is small.

As shown in FIG. 5C, after drying the ink 1060x, the height Hx of the pinning location Px is relatively low, which causes the organic light-emitting layer 106x to swell at the central portion of the sub-pixel to a film thickness of Tx.

Figure 5D:
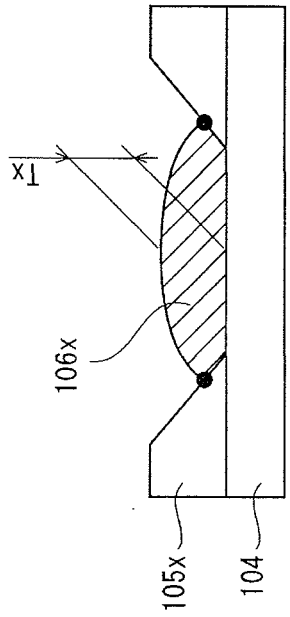
FIG. 5D is a schematic cross-sectional view showing the condition of the organic light-emitting layer after drying when the taper angle of the bank sidewall is large.

On the other hand, as shown in FIG. 5D, after drying the ink 1060y, the height Hy of the pinning location Py is relatively high, which causes the organic light-emitting layer 106y to sag at the central portion of the sub-pixel to a film thickness of Ty.

The thicknesses Tx and Ty satisfy the following relationship.

$$Tx > Ty \quad \text{[Expression 8]}$$

FIG. 6 summarizes the above relationships. As shown in FIG. 6, as the inclination angle (taper angle) θ of the bank 105 grows smaller, the pinning height H lowers, and as a result, the film thickness T of the organic light-emitting layer 106 becomes thicker. Conversely, as the inclination angle (taper angle) θ of the bank 105 grows larger, the pinning height H becomes higher, and as a result, the film thickness T of the organic light-emitting layer 106 becomes thinner.

Figure 7:
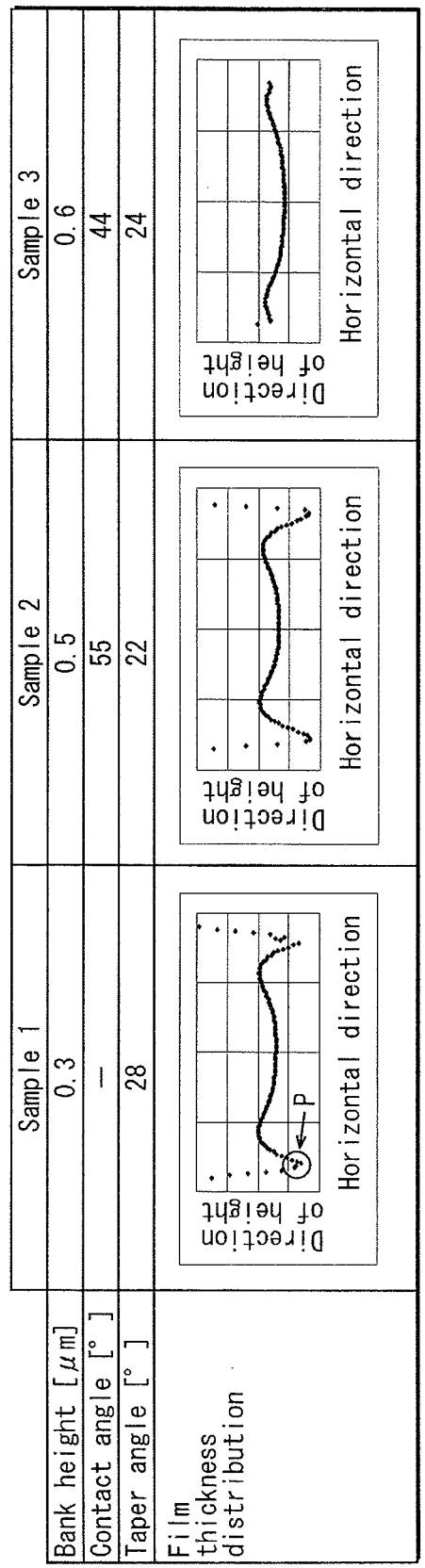
FIG. 7 shows a distribution of film thickness of the organic light-emitting layer in samples 1-3.
Figure 8:
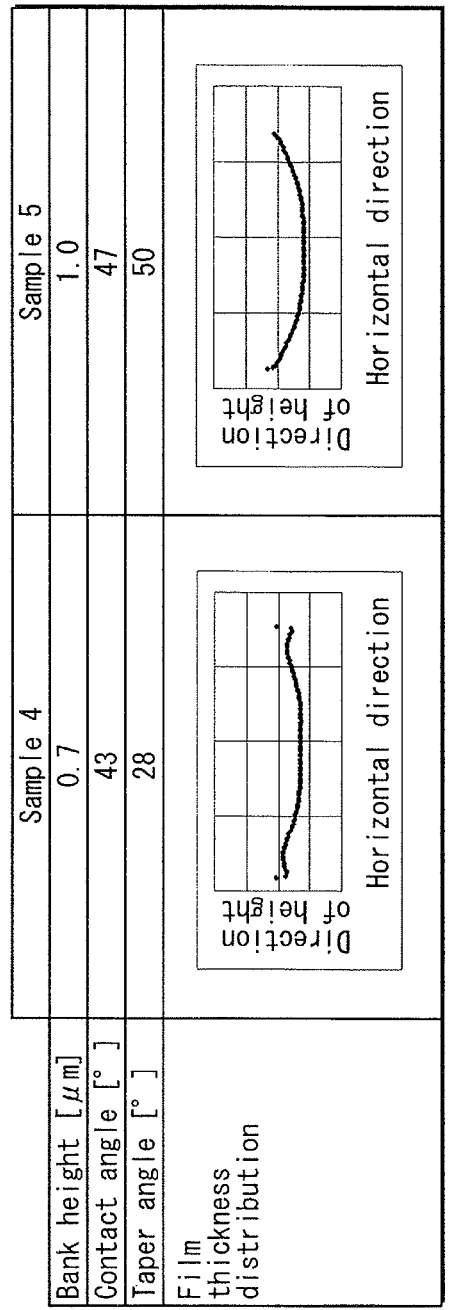
FIG. 8 shows a distribution of film thickness of the organic light-emitting layer in samples 4 and 5.

Based on the above factors, five samples were created and evaluated. FIGS. 7 and 8 show the results.

As shown in FIGS. 7 and 8, as compared to the distribution of film thickness of sample 2, the pinning location is higher in samples 3 and 4, which have a larger taper angle. Note that in FIGS. 7 and 8, the horizontal axis represents the horizontal direction, and the vertical axis represents the direction of height.

In sample 5, however, in which the bank has a taper angle (inclination angle) of 50°, the film thickness is less uniform than in sample 2.

6. Manufacturing Method of Display Panel 40

The following describes the characteristic processes of the manufacturing method of the display panel 10 according to the present Embodiment with reference to FIGS. 9 and 10. Note that with regard to the manufacturing processes that are omitted in the following description, any of the variety of processes suggested by conventional technologies may be used.

First, as shown in FIG. 9A, above the substrate 101 in the direction of the Z axis, anodes 102 and electrode coating layers 103 are layered in this order in regions in which sub-pixels 1000a, 1000b, and 1000c are to be formed. Furthermore, a bus bar 302 and an electrode coating layer 303 are layered in this order in regions 1000d and 1000e in which non-light-emitting cells are to be formed. A hole injection transporting layer 104 is then layered on top of the electrode coating layers 103 and 303 so as to cover the entire surface. The anodes 102 and the bus bar 302 are formed, for example, by first forming a thin film made of Al or Al alloy or a thin Ag film by the sputtering method or vacuum deposition method and then patterning the thin Ag film by the photolithography method.

The electrode coating layers 103 and 303 are formed, for example, by forming a thin ITO film on the surface of the anodes 102 using a method such as the sputtering method and then patterning the thin ITO film by a method such as photolithography. To form the hole injection transporting layer 104, first a metal film is formed on the surface of the substrate 101, including the surfaces of the electrode coating layers 103 and 303, by a method such as the sputtering method. Subsequently, the metal film becomes oxidized, forming the hole injection transporting layer 104.

Next, as shown in FIG. 9B, the spin coat method, for example, is used to form a bank material layer 1050 so as to cover the top of the hole injection transporting layer 104. A photoresist material is used to form the bank material layer 1050. Specifically, as described above, an organic material having insulating properties such as acrylic resin, polyimide resin, novolac-type phenolic resin, etc. can be used.

Next, as shown in FIG. 9C, a mask 501 is placed above the bank material layer 1050, the mask 501 having openings 501a, 501b, 501c, and 501d at the locations for forming the banks. In this state, exposure is performed via the openings 501a, 501b, 501c, and 501d of the mask 501.

Note that, as shown in FIG. 9C, in the mask 501, a width Wb of the opening 501b located on the left-hand side of a region 1000b in which a sub-pixel is to be formed (hereinafter, such a region is referred to as "planned sub-pixel formation region"), is defined by points Pb1 and Pb2 positioned at the foots of the sidewalls 105ba and 105bb of the bank 105b that is to be formed (see FIG. 4). The opening 501c in the mask 501, which is located on the right-hand side of the planned sub-pixel formation region 1000b, is defined by a similar relationship.

On the other hand, a width Wa1 of the opening 501a located between the planned sub-pixel formation region 1000a and the planned non-light-emitting cell formation region 1000d is defined by a point Pa1 being at the upper edge of the sidewall 105aa of the bank 105a that is to be formed (see FIG. 4) and a point Pa2 being at the foot of the bank on the planned non-light-emitting cell formation region 1000d side (see FIG. 4); and a width Wd1 of the opening 501d located between the planned sub-pixel formation region 1000c and the planned non-light-emitting cell formation region 1000e is defined by a point Pd1 being at the upper edge of the sidewall 105dc of the bank 105d that is to be formed (see FIG. 4) and a point Pd2 being at the foot of the bank on the planned non-light-emitting cell formation region 1000e side (see FIG. 4).

Next, as shown in FIG. 10A, a mask 502 is placed above the bank material layer 1050, the mask 502 having openings 502a and 502d at the locations corresponding to respective sidewalls 105aa and 105dc of the banks 105a and 105d (see FIG. 4). In this state, the second exposure is performed via the openings 502a and 502d of the mask 502.

Note that, as shown in FIG. 10A, in the mask 502, a width Wa2 of the opening 502a is defined by a point Pa3 being at the foot of the sidewall 105aa of the bank 105a that is to be formed and a point Pa1 being at the upper edge of the sidewall 105aa; and a width Wd2 of the opening 502d is defined by a point Pd3 being at the foot of the sidewall 105dc of the bank 105d that is to be formed and a point Pd1 being at the upper edge of the sidewall 105dc.

Next, the development and baking are performed to form the banks 105a, 105b, 105e, and 105d as shown in FIG. 10B. As described above, the sidewall 105aa of the bank 105a on the planned sub-pixel formation region 1000a side and the sidewall 105dc of the bank 105d on the planned sub-pixel formation region 1000c side are larger than the sidewalls 105ba, 105bb, 105cb, and 105cc of the banks 105b and 105c in inclination angle.

Figure 11:
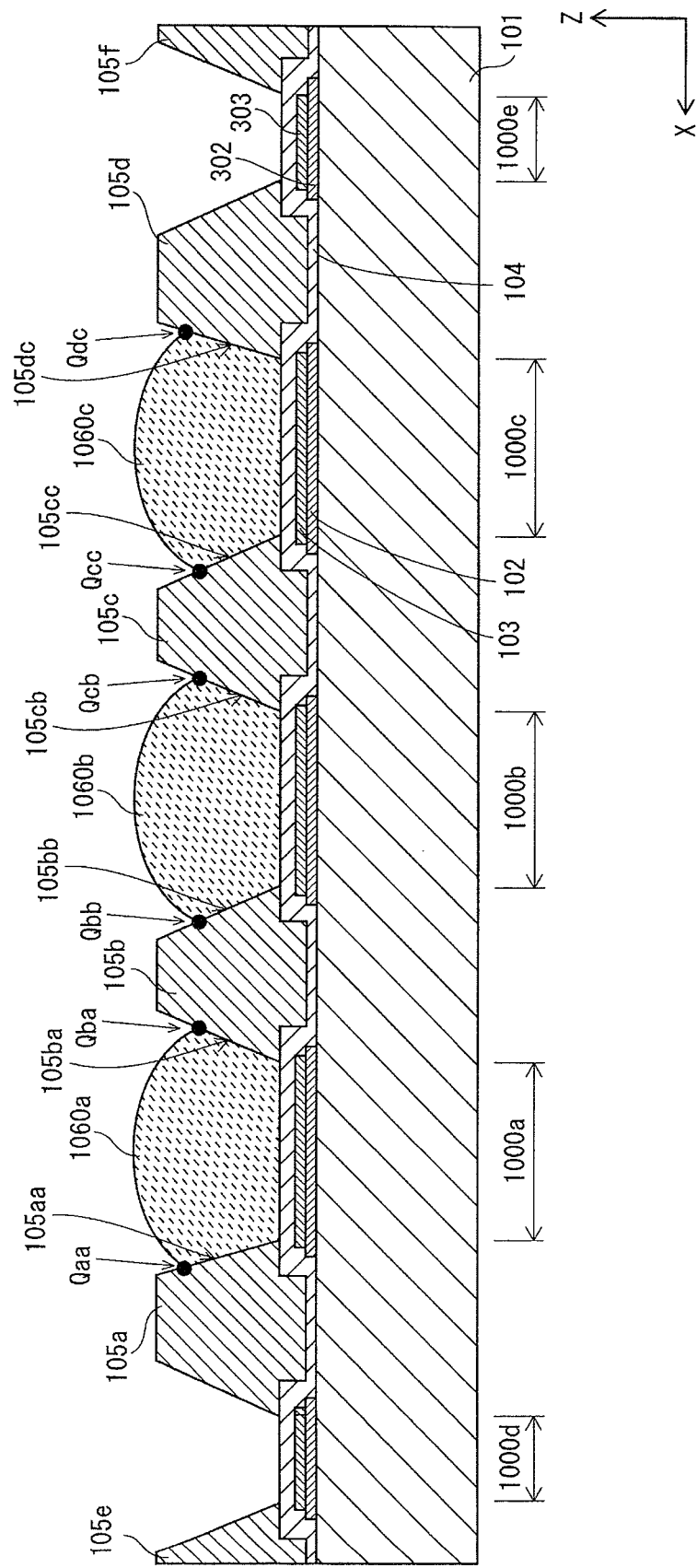
FIG. 11 is a schematic cross-sectional view showing an ink application process in the manufacturing method of the display panel 10.

Subsequently, as shown in FIG. 11, the following inks are applied to the following openings substantially at the same time by the inkjet method or the like, the inks all including an organic light-emitting material: ink 1060a to an opening (the planned sub-pixel formation region 1000a) bounded by the banks 105a and 105b; ink 1060b to an opening (the planned sub-pixel formation region 1000b) bounded by the banks 105b and 105c; and ink 1060c to an opening (the planned sub-pixel formation region 1000c) bounded by the banks 105c and 105d.

Here, since, as described above, the inclination angle θaa of the sidewall 105aa of the bank 105a and the inclination angle θdc of the sidewall 105dc of the bank 105d are set to be larger than the inclination angles θba, θbb, θcb, and θcc of the other sidewalls, the pinning locations Qaa and Qdc of the inks 1060a and 1060c in the sidewalls 105aa and 105dc of the banks 105a and 105d become higher in position than the pinning locations Qba, Qbb, Qcb, and Qcc.

By setting the pinning locations Qaa and Qdc to be higher than the other pinning locations Qba, Qbb, Qcb, and Qcc, it is possible to prevent the formed organic light-emitting layer from having a non-uniform film thickness. More specifically, when an ink application method of applying the inks 1060a, 1060b, and 1060c substantially at the same time is adopted, due to the presence of the planned non-light-emitting cell formation regions 1000d and 1000e on the left-hand side of the planned sub-pixel formation region 1000a and on the right-hand side of the planned sub-pixel formation region 1000c respectively, non-uniformity of vapor concentration distribution in the horizontal direction arises in each of the planned sub-pixel formation regions 1000a and 1000c. In such a case, by setting the respective inclination angles θaa and θdc of the sidewalls 105aa and 105dc of the banks 105a and 105d to be larger than those of the other sidewalls, the formed organic light-emitting layer 106 can be prevented from having a non-uniform film thickness.

Note that, although not illustrated, subsequently the ink is dried, and the electron injection layer 107, cathode 108, passivation layer 109, etc, are layered in this order to form the display panel 10.

7. Advantageous Effects

As shown in FIG. 4, in the display panel 10 of the display device 1 according to the present Embodiment, inclination angle θaa of the sidewall 105aa of the bank 105a positioned on the sub-pixel 100a side, and inclination angle θdc of the sidewall 105dc of the bank 105d positioned on the sub-pixel 100c side, are set larger than the inclination angles θba, θbb, θcb, and θcc of other sidewalls 105ba, 105bb, 105cb, and 105 cc. As a result, as shown in FIG. 11, when the inks 1060a, 1060b, and 1060c are applied, the pinning locations Qaa and Qdc are higher in position than the other pinning locations Qba, Qbb, Qcb, and Qcc.

θn the other hand, inclination angles θba, θbb, θcb, and θcc of sidewalls 105ba, 105bb, 105cb, and 105cc are equal.

This enables sub-pixels 100a, 100b, and 100c to have a uniform film thickness in the organic light-emitting layer 106 of the display panel 10 after drying, which produces an advantageous effect of having little luminance unevenness.

Note that, by using the manufacturing method of the display device 1 in the present Embodiment, which has been described with reference to FIGS. 9, 10, and 11, the display device 1 having the above advantageous effect can be manufactured.

Also, the term "equal" does not necessarily mean that the targets are completely equal with each other in numerical value, but includes, for example, a measurement error in manufacturing of the display device 1. More specifically, it is suggested that, in the display panel 10, the inclination angles are recognized as being equal as far as the difference in luminous efficiency (luminance unevenness) between sub-pixels 100a, 100b, and 100c, which correspond to the inclination angles, falls in an acceptable range.

[Modification 1]

Figure 12:
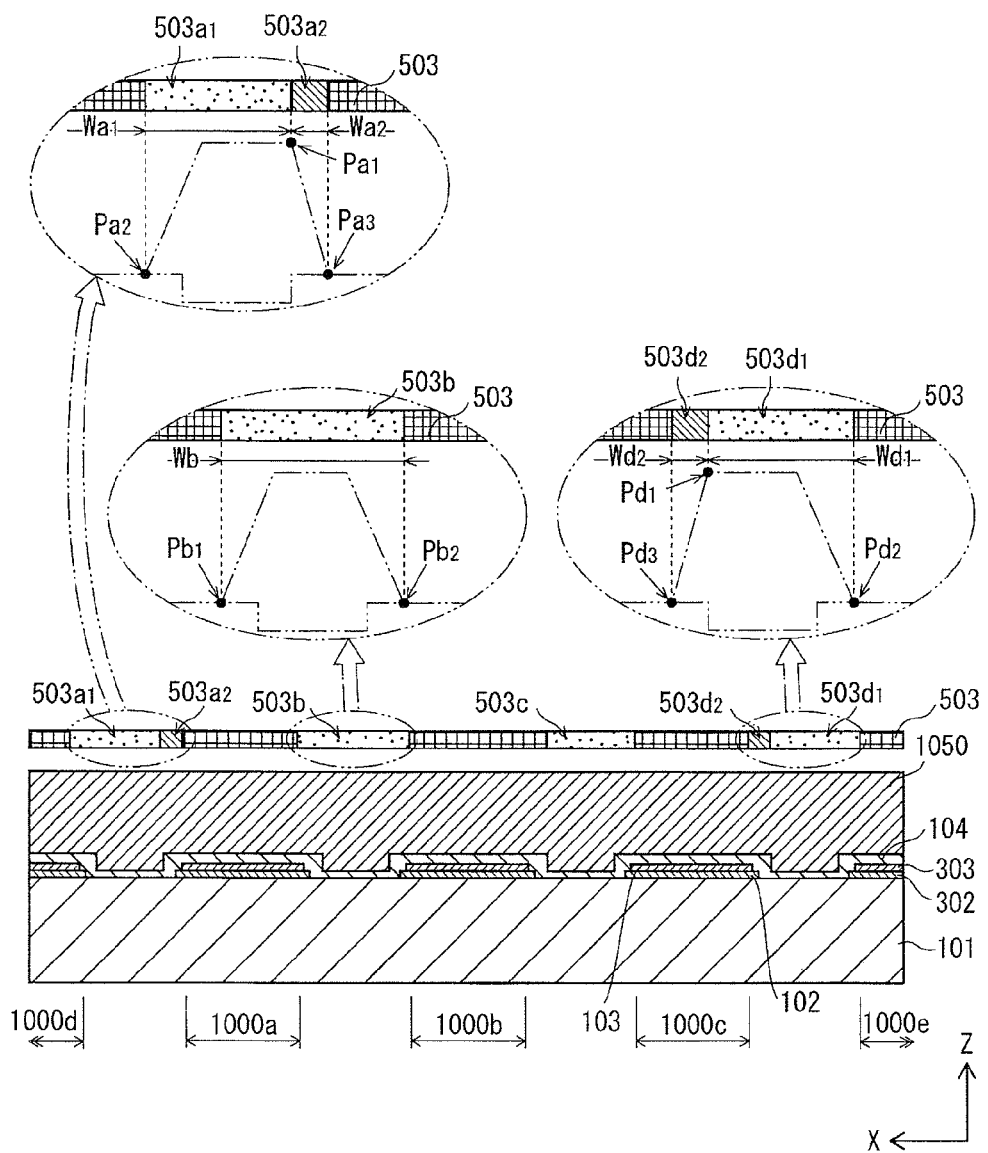
FIG. 12 is a schematic cross-sectional view showing the main processes in the manufacturing method of Modification 1.

Next, with reference to FIG. 12, Modification 1 of the manufacturing method of the display device 1 is described. FIG. 12 illustrates processes corresponding to processes illustrated in FIGS. 9C to 10A.

As shown in FIG. 12, first a bank material layer 1050 is formed to cover the hole injection transporting layer 104, and then a mask 503 is placed above the bank material layer 1050. The mask 503 is provided with light transmissive portions 503a1, 503a2, 503b, 503c, 503d1, and 503d2. The light transmissive portions 503a1 and 503a2 are provided at locations corresponding to a portion in which the bank 105a is to be formed; the light transmissive portion 503b is provided at a location corresponding to a portion in which the bank 105b is to be formed; the light transmissive portion 503c is provided at a location corresponding to a portion in which the bank 105c is to be formed; and the light transmissive portions 503d1 and 503d2 are provided at locations corresponding to a portion in which the bank 105d is to be formed.

In the manufacturing method of the display device 1 in Modification 1, width Wb of the light transmissive portion 503b, which corresponds to the left-hand side of the planned sub-pixel formation region 1000b, is defined by points Pb1 and Pb2 at the feet of the sidewalls 105ba and 105bb of the bank 105b (see FIG. 4) that is to be formed.

On the other hand, width Wa1 of the light transmissive portion 503a1, which corresponds to a region between the planned sub-pixel formation region 1000a and the planned non-light-emitting cell formation region 1000d, is defined by a point Pa2 being at the foot of the bank 105a that is to be formed (see FIG. 4); and width Wa2 of the light transmissive portion 503a2 is defined by points Pa1 and Pa3 that are positioned at the upper edge and the foot of the sidewall 105aa of the bank 105a that is to be formed, respectively (see FIG. 4). Similarly, width Wd1 of the light transmissive portion 503d1, which corresponds to a region between the planned sub-pixel formation region 1000c and the planned non-light-emitting cell formation region 1000e, is defined by a point Pd2 being at the foot of a sidewall of the bank 105d to be formed, on the planned non-light-emitting cell formation region 1000e side (see FIG. 4); and width Wd2 of the light transmissive portion 503d2 is defined by points Pd1 and Pd3 that are positioned at the upper edge and the foot of the sidewall 105dc of the bank 105d, respectively (see FIG. 4).

The mask 503 is made from a half-tone or the like, and the light transmissive portions 503a1, 503b, 503c, and 503d1 differ from the light transmissive portions 503a2 and 503d2 in light transmissivity. More specifically, the light transmissive portions 503a2 and 503d2 are larger than the light transmissive portions 503a1, 503b, 503c, and 503d1 in light transmissivity.

In the state where the mask 503 having the above structure is set in place, the exposure and development, and then baking are performed to form the banks 105a, 105b, 105c, and 105d as shown in FIG. 10B. That is to say, sidewalls having larger inclination angles are formed at locations which are exposed to light via the light transmissive portions 503a2 and 503d2 having a larger light transmissivity than the light transmissive portions 503a1, 503b, 503c, and 503d1, in accordance with the relationships indicated by the Expressions 1 and 2.

Note that subsequent processes are the same as those in the above Embodiment.

The display device 1 can be manufactured by the above manufacturing method as well.

[Modification 2]

Next, with reference to FIGS. 13 and 14, Modification 2 of the manufacturing method of the display device 1 is described. FIGS. 13A to 14B illustrate processes corresponding to the processes illustrated in FIGS. 9C to 10B.

As shown in FIG. 13A, first a bank material layer 1050 is formed to cover the hole injection transporting layer 104, and then a mask 504 is placed above the bank material layer 1050. The mask 504 has openings 504a, 504b, 504c, and 504d corresponding to the portions at which banks 105 are to be formed.

The openings 504b and 504c are formed to have the same width as the openings 501b and 501c in the mask 501 used in the manufacturing method of the above Embodiment.

On the other hand, a width Wa3 of the opening 504a located between the planned sub-pixel formation region 1000a and the planned non-light-emitting cell formation region 1000d in correspondence with the bank 105a that is to be formed (see FIG. 4) is set to be larger than a width that is defined by points Pa1 and Pa3 being at the feet of the bank 105a that is to be formed (see FIG. 4), as indicated by the two dot chain line in FIG. 13A; and a width Wd3 of the opening 504d located between the planned sub-pixel formation region 1000c and the planned non-light-emitting cell formation region 1000e in correspondence with the bank 105d that is to be formed (see FIG. 4) is set to be larger than a width that is defined by points Pd2 and Pd3 being at the feet of the bank 105d that is to be formed (see FIG. 4), as indicated by the two dot chain line in FIG. 13A. More specifically, the width is made larger at the portions where the inclination angles are to be larger.

In the state where the mask 504 is set in place as shown in FIG. 13A, the exposure and development in the first round are performed. After this process is performed, as shown in FIG. 13B, bank material layers 1051a, 1051b, 1051c, and 1051d remain in the locations corresponding to the openings 504a, 504b, 504c, and 504d.

Note that, as shown in FIG. 13B, the inclination angles of the sidewalls in the bank material layers 1051a, 1051b, 1051c, and 1051d are uniform after the first exposure and development are performed. It should be noted however that the widths of the bank material layers 1051a and 1051d in the X axis direction are larger than the widths of the bank material layers 1051b and 1051c in the X axis direction.

In Modification 2, the baking is not performed at this point in time.

As shown in FIG. 14A, a mask 505 is placed above the bank material layers 1051a, 1051b, 1051c, and 1051d after they are formed. In the mask 505, openings (505a and 505d) are provided only at the locations where the inclination angles are to be larger (sidewall 105aa of the bank 105a, and sidewall 105dc of the bank 105d) among the locations in the mask 505 corresponding to the sidewalls of the banks 105a, 105b, 105c, and 105d that are to be formed.

In the state where the mask 505 is set in place, the exposure and development in the second round are performed, and then the baking is performed to form the banks 105a, 105b, 105c, and 105d as shown in FIG. 14B.

Subsequently, the display device 1 can be manufactured by performing the same processes as in the above Embodiment or the like.

[Verification of Manufacturing Method]

Using a concrete example, the shape of the banks after formation was verified for the manufacturing methods of the above Embodiment and Modifications 1 and 2. The results are described with reference to FIG. 16.

Figure 15A:
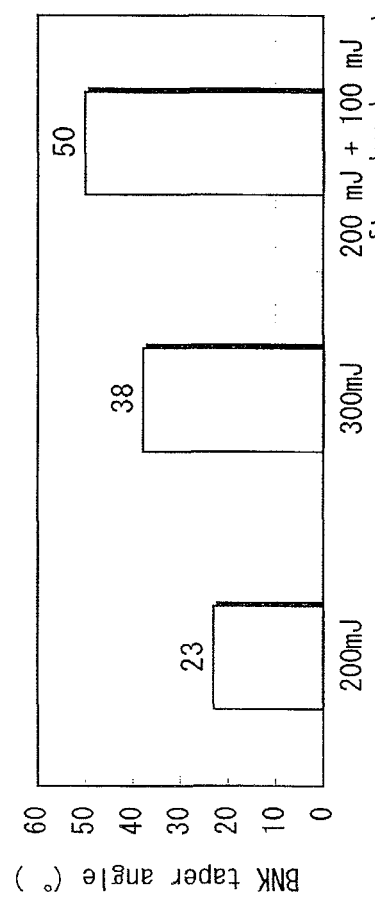
FIG. 15A shows the relationship between the taper angle of a bank and exposure/developing.

As shown in FIG. 15A, the larger the amount of exposure is, the larger the inclination angle of a sidewall of a formed bank is. More specifically, when the exposure and development are performed with 200 mJ of exposure amount, the inclination angle of a sidewall of the formed bank is 23°, whereas when the exposure and development are performed with 300 mJ of exposure amount, the inclination angle of a sidewall of the formed bank is 38°. The results are also shown by the Atomic Force Microscope (AFM) in FIG. 15B.

Figure 15B:
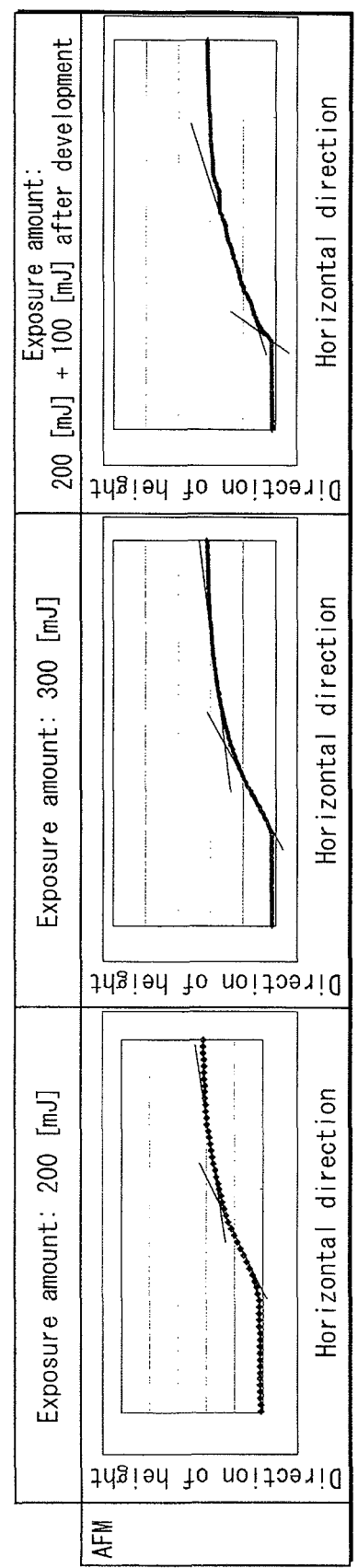
FIG. 15B shows AFM graphs that indicate the shapes of formed banks.

Furthermore, as shown in FIGS. 15A and 15B, when the exposure and development in the first round is performed with 200 mJ of exposure amount and then the exposure and development in the second round is performed with 100 mJ of exposure amount, the inclination angle of a sidewall of the formed bank is 50°. This corresponds to the manufacturing method of Modification 2 and is considered to be effective in creating a large inclination angle of the bank sidewall.

Note that in FIG. 15B, the horizontal axis represents the horizontal direction, and the vertical axis represents the direction of height.

[Other Considerations]

Figure 16A:
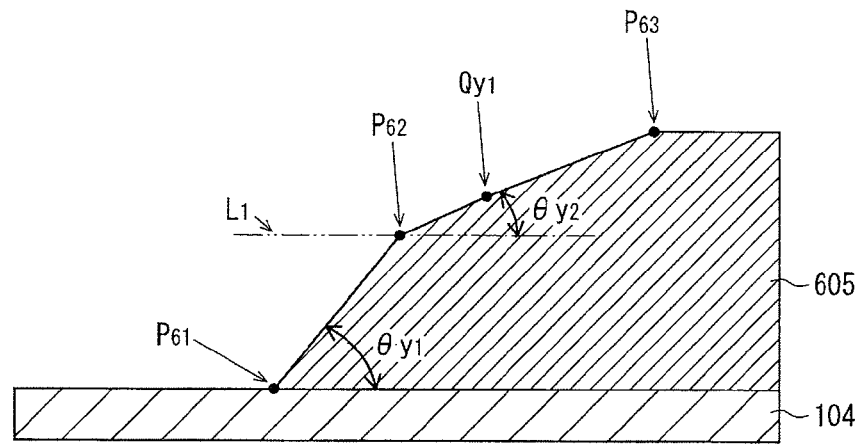
FIGS. 16A and 16B are schematic cross-sectional views provided for explanation of definition of the taper angle.
Figure 16B:
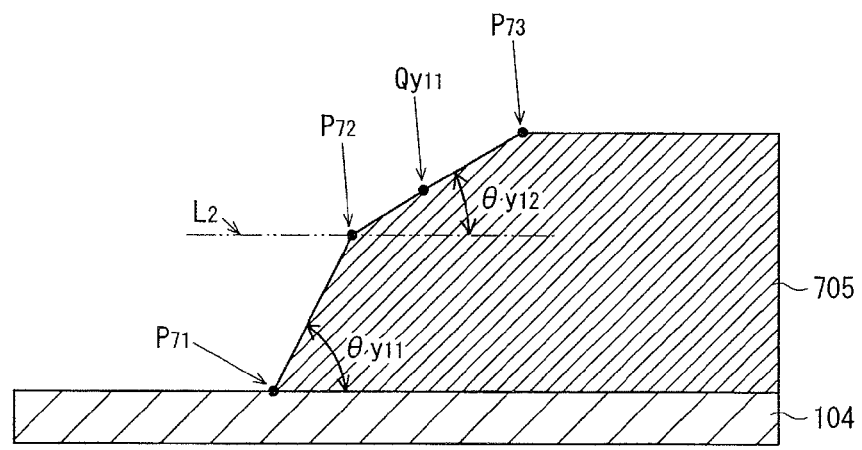

Firstly, in the above Embodiment and Modifications 1 and 2, it is schematically illustrated that the surface of each sidewall of the banks 105, 105a-105d, 105x, and 105y is planar. However, the surface of each sidewall of the banks may not necessarily be planar. For example, FIG. 16A illustrates a bank 605 whose sidewall has two surfaces: a surface extending from a point $P_{61}$ to a point $P_{62}$; and a surface extending from the point $P_{62}$ to a point $P_{63}$. In this case, a pinning location Qy1 during ink application is present on the surface between the points $P_{62}$ and $P_{63}$. Here, an inclination angle $\theta y2$ formed between this the surface and a virtual straight line $L_1$ passing through the point $P_{62}$ is important in the relationship with the pinning location.

However, the angle $\theta y2$ can be controlled by controlling an angle $\theta y1$, which is formed between the surface of the underlying layer, namely the hole injection transporting layer 104, and the surface between points $P_{61}$ and $P_{62}$ of the sidewall of the bank 605, when the bank 605 is formed. Thus, in the actuality, the above effects can be obtained by controlling the inclination angle $\theta y1$. For example, if a bank 705 is formed such that an angle $\theta y11$ formed between the surface of the hole injection transporting layer 104 and a surface between points $P_{71}$ and $P_{72}$ is larger than the angle $\theta y1$ shown in FIG. 16A (see FIG. 16B), then an angle $\theta y12$ formed between a surface between points $P_{72}$ and $P_{73}$ and a virtual straight line $L_2$ also becomes larger than the angle $\theta y2$ shown in FIG. 16A.

Secondly, in the above Embodiment and Modifications 1 and 2, it is not specified to what part of the region of the display panel 10 the above-described structure can be applied. However, the above-described structure may be applied to the entire region of the display panel, or may be applied to a part of the region. As shown in FIG. 17, the display panel 10 can be divided formally into areas 10a and 10b in a direction along the surface of the display panel 10, wherein the area 10a is located at the center, and the area 10b surrounds the area 10a. The area 10a is connected to a source electrode or a drain electrode of the TFT layer below which the anodes are formed, and contributes to the emission of light. On the other hand, the area 10b is not connected to any of the source electrode and drain electrode of the TFT layer below which the anodes are formed, and does not contribute to the emission of light. It is considered that, if the area 10a is further divided formally into a central area 10a1 and a surrounding area 10a2, the uneven film thickness in the organic light-emitting layers of the sub-pixels in the surrounding area 10a2 would be more prominent due to the state of vapor concentration distribution during the application of ink.

Note that the combined area of the surrounding area 10a2 and the area 10b may occupy approximately 0.5% to several percent (for example, 1%) of the total area of the panel. This range is determined by taking account of the variation in film thickness of the organic light-emitting layers when the inclination angles of the bank sidewalls are not adjusted.

In the above Embodiment and Modifications 1 and 2, the structures are adopted by way of example to clearly explain the structure, acts and effects of the present invention. Accordingly, the present invention is not limited to the above structures, except for such portions that are essential to the present invention. For example, the above Embodiment has adopted, as one example, a structure in which the anodes 102 are located below the organic light-emitting layers 106 in the Z axis direction, as shown in FIG. 2. However, not limited to this structure, the present invention may adopt a structure in which the cathodes 108 are located below the organic light-emitting layers 106 in the Z axis direction.

The display panel has the top-emission structure when it adopts the structure in which the cathodes 108 are located below the organic light-emitting layers 106 in the Z axis direction. In that case, the cathodes 108 become the reflecting electrode layers, and the electrode coating layers 103 are formed above the cathodes 108.

Figure 18:
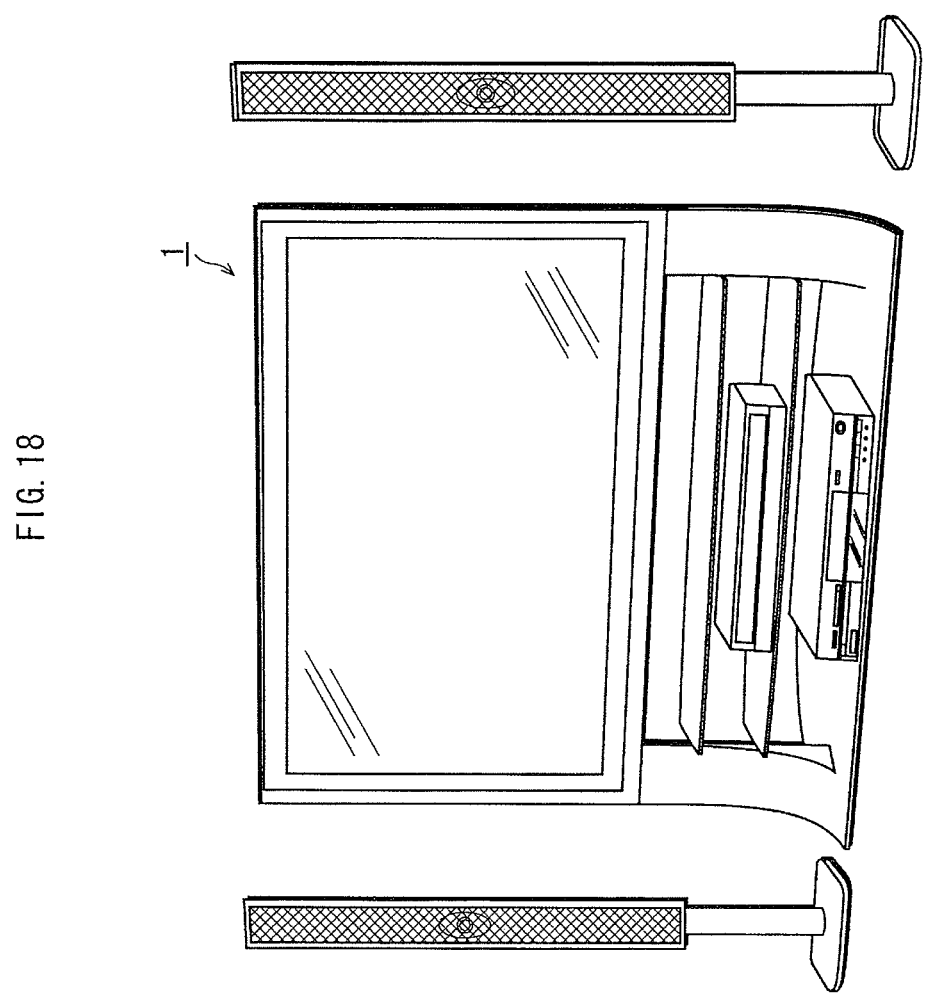
FIG. 18 is an external perspective view showing an example of the appearance of a set that includes the organic display device 1.

Furthermore, the above Embodiment and Modifications do not provide a specific example of the appearance of the display device 1. However, the display device 1 may be formed as a part of a system illustrated in FIG. 18, for example. Note that an organic EL display device does not require a backlight as a liquid crystal display device does, and thus is suitable for thin display devices and has excellent characteristics from the view point of system design.

Also, in the above Embodiment and Modifications 1 and 2, a so-called line bank structure is adopted for the banks 105, 105a-105f, 105x, 105y, 605, and 705, as shown in FIG. 3. However, not limited to this, the structure of pixel bank 805 shown in FIG. 19 may be adopted. In this structure, a display panel 80 includes the pixel bank 805 which is composed of bank elements 805a and bank elements 805b, wherein the bank elements 805a extend in the Y axis direction and the bank elements 805b extend in the X axis direction.

Figure 19:
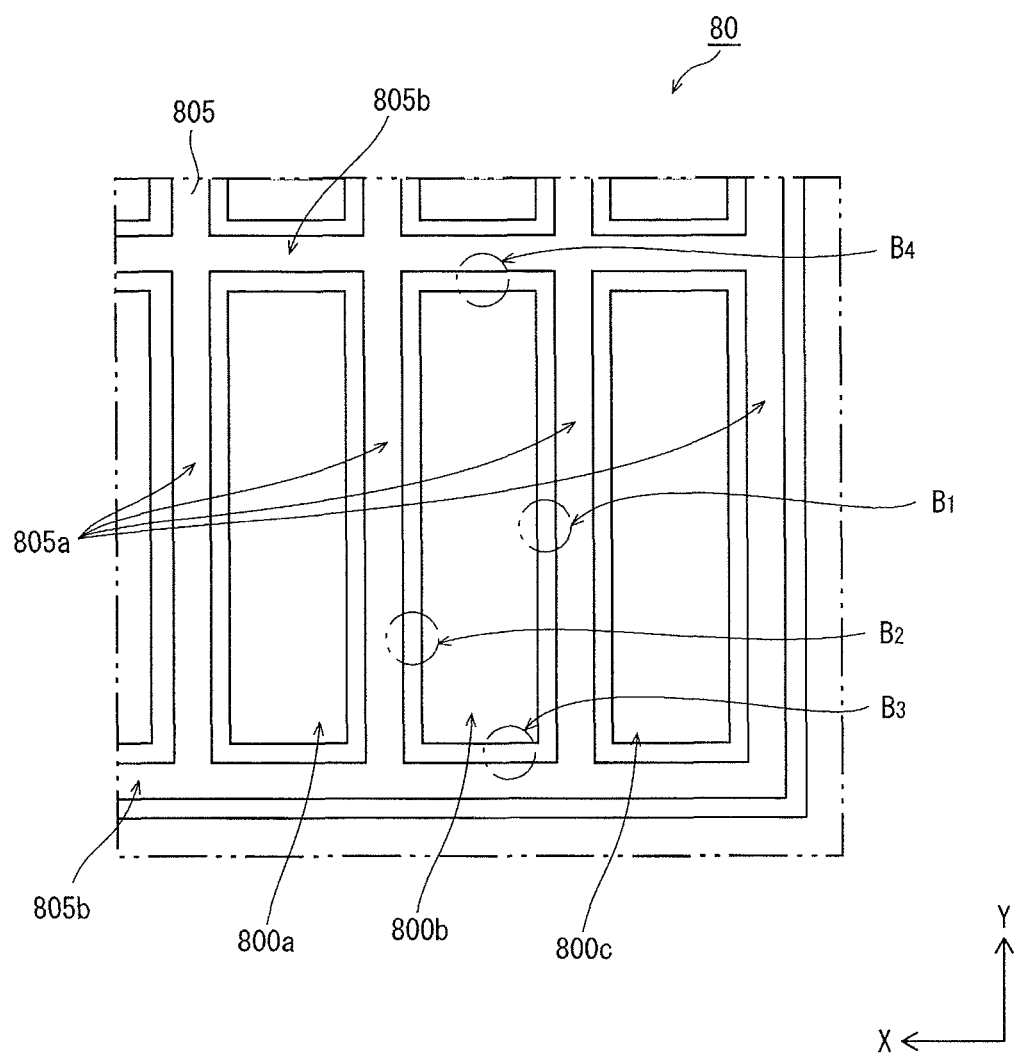
FIG. 19 is a schematic plan view showing a bank 805 in a display panel 80 of Modification 3.

As shown in FIG. 19, when the structure of pixel bank 805 is adopted, the same advantageous effects as the above ones can be obtained by increasing the inclination angles of the sidewalls of the bank 805 in the X and Y axis directions defining the sub-pixels 800a, 800b, and 800c. More specifically, the above advantageous effects can be obtained by appropriately adjusting the inclination angles of the sidewalls indicated by the arrows $B_1$, $B_2$, $B_3$, and $B_4$.

Also, the inclination angles of the sidewalls of the banks adopted in the above Embodiment and Modifications 1 and 2 may be individually adjusted depending on the vapor concentration distribution observed in the ink application process and drying process when the organic light-emitting layers are formed in the manufacturing process. For example, if the drying device used in the ink drying process has a structure where the vapor flows from the outer circumference of the panel toward the center of the panel, bank sidewalls where the organic light-emitting layers are large in film thickness may have increased inclination angles. This enables the film thickness of the organic light-emitting layers to be uniform, thereby reducing the unevenness in luminance over the entire panel.

In the above Embodiment and in Modifications 1 and 2, the inclination angle (i.e. taper angle) of bank sidewalls is set in the same manner, without distinction between the luminescent colors (red, green, and blue). However, there may be a case where the organic light-emitting materials of the ink for the respective luminescent colors have different characteristics. In that case, the inclination angles of the bank sidewalls may be defined in accordance with the ink characteristics of each luminescent color.

INDUSTRIAL APPLICABILITY

The present invention is useful for providing an organic light-emitting panel and an organic display device that exhibit substantially even luminance and are capable of displaying high-quality images.

REFERENCE SIGNS LIST 1 display device
10, 80 display panel
10a1 light-emitting central area
10a2 light-emitting surrounding area
10b dummy area
20 drive control unit
21-24 drive circuit
25 control circuit
100, 100a-100c sub-pixel
100d, 100e non-light-emitting cell
101 substrate
102 anode
103, 303 electrode coating layer
104 hole injection layer
105, 105a-105f, 105x, 105y, 605, 705, 805 bank
106, 106x, 106y organic light-emitting layer
107 electron injection layer
108 cathode
109 passivation layer
302 bus bar
501-505 mask
1000a-1000c region in which sub-pixel is to be formed
1000d, 1000e non-light-emitting cell
1050, 1051a, 1051b, 1051c, 1051d bank material layer
1060a-1060c, 1060x, 1060y ink

The invention claimed is:

1. An organic light-emitting panel, comprising:
an array of a plurality of pixels;
non-light-emitting cells, each being provided between a different pair of adjacent pixels;
a plurality of light-emitting cells provided in such a manner that each pixel includes at least three light-emitting cells that are arranged in an alignment and emit light of different colors, the at least three light-emitting cells including a first light-emitting cell located at an end of the alignment, a second light-emitting cell located at a central portion of the alignment, and a third light-emitting cell located at another end of the alignment;
an underlying layer below the array of the plurality of pixels;
a plurality of first electrodes, each included in the underlying layer and below a different one of the plurality of light-emitting cells;
a plurality of organic light-emitting layers each in a different one of the plurality of light-emitting cells by applying, for each pixel, at least three types of ink, that contain different organic light-emitting materials corresponding one-to-one to the different colors of the light, respectively to the at least three light-emitting cells substantially at a same time;
a second electrode away from the underlying layer with each organic light-emitting layer therebetween; and
a plurality of banks above the underlying layer, separating the light-emitting cells, and defining each light-emitting cell,
each of the plurality of pixels being structured such that:
among sidewalls facing each other in two adjacent banks defining the first light-emitting cell and two adjacent banks defining the third light-emitting cell, first sidewalls adjacent to the non-light-emitting cells have larger inclination angles than second sidewalls adjacent to the second light-emitting cell,
third sidewalls facing each other in two adjacent banks defining the second light-emitting cell have substantially equal inclination angles,
the plurality of organic light emitting layers extend along corresponding ones of the first sidewalls, the second sidewalls, and the third sidewalls, and
an inclination angle of each of the first sidewalls, the second sidewalls, and the third sidewalls is an angle formed by a corresponding one of the first sidewalls the second sidewalls, and the third sidewalls and the underlying layer from which each of the first sidewalls, the second sidewalls, and the third sidewalls inclines.

2. The organic light-emitting panel of claim 1, wherein each of the non-light-emitting cells includes none of the organic light-emitting layers, includes a third electrode made of a same material as a material of the first electrodes, is below the second electrode, and electrically connects the third electrode with the second electrode.

3. The organic light-emitting panel of claim 1, wherein the first sidewalls adjacent to the non-light-emitting cells among the sidewalls facing each other in the two adjacent banks defining the first light-emitting cell and the two adjacent banks defining the third light-emitting cell have substantially equal inclination angles.

4. The organic light-emitting panel of claim 1, wherein the second sidewalls adjacent to the second light-emitting cell among the sidewalls facing each other in the two adjacent banks defining the first light-emitting cell and the two adjacent banks defining the third-light-emitting cell and the third sidewalls facing each other in the two adjacent banks defining the second light-emitting cell have substantially equal inclination angles.

5. The organic light-emitting panel of claim 1, wherein one of the second sidewalls adjacent to the second light-emitting cell among the sidewalls facing each other in the two adjacent banks defining the third light-emitting cell and the third sidewalls facing each other in the two adjacent banks defining the second light-emitting cell have substantially equal inclination angles.

6. The organic light-emitting panel of claim 1, wherein
the inclination angles of the first sidewalls adjacent to the non-light-emitting cells among the sidewalls facing each other in the two adjacent banks defining the first light-emitting cell and the
two adjacent banks defining the third light-emitting cell are in a range from 35 degrees to 45 degrees inclusive,
the inclination angles of the second sidewalls adjacent to the second light-emitting cell among the sidewalls facing each other in the two adjacent banks defining the first light-emitting cell and the
two adjacent banks defining the third light-emitting cell are in a range from 25 degrees to 35 degrees inclusive, and
the inclination angles of the third sidewalls facing each other in the two adjacent banks defining the second light-emitting cell are in a range from 25 degrees to 35 degrees inclusive.

7. An organic display device including the organic Light-emitting panel defined in claim 1.

8. A manufacturing method of an organic light-emitting panel including an array of a plurality of pixels and non-light-emitting cells that are each provided between a different pair of adjacent pixels, the manufacturing method comprising:
forming, on a substrate, an underlying layer including a plurality of first electrodes;
layering a photoresist material on the underlying layer;
forming, for each pixel, a plurality of openings corresponding to a plurality of light-emitting cells and openings corresponding to the non-light-emitting cells by performing an exposure with a mask laid on the layered photoresist material to form a pattern, and forming a plurality of banks to separate the light-emitting cells and the non-light-emitting cells and define each light-emitting cell and each non-light-emitting cell;
forming a plurality of organic light-emitting layers by dripping ink that includes organic light-emitting materials into the plurality of openings corresponding to the plurality of light-emitting cells, and drying the ink; and
forming a second electrode above each organic light-emitting layer,
wherein, when forming the plurality of opening s , for each of at least part of the plurality of pixels to be formed, a first opening corresponding to a first light-emitting cell located at an end of an alignment in which the light-emitting cells are to be formed, a second opening corresponding to a second light-emitting cell located at a central portion of the alignment, and a third opening corresponding to a third light-emitting cell located at another end of the alignment are formed,
among sidewalls facing each other in two adjacent banks defining the first light-emitting cell and two adjacent banks defining the third light-emitting cell, first sidewalls adjacent to the non-light-emitting cells have larger inclination angles than second sidewalls adjacent to the second light-emitting cell,
third sidewalls facing each other in two adjacent banks defining the second light-emitting cell have substantially equal inclination angles,
the plurality of organic light-emitting layers are formed by dripping, for each pixel, three types of ink corresponding one-to-one to three colors of light into the first opening, the second opening and the third opening substantially at a same time,
the plurality of organic light emitting layers extend along corresponding ones of the first sidewalls, the second sidewalls, and the third sidewalls, and
an inclination angle of each of the first sidewalls, the second sidewalls, and the third sidewalls is an angle formed b a corresponding one of the first sidewalls the second sidewalls and the third sidewalls and the underlying layer from which each of the first sidewalls, the second sidewalls, and the third sidewalls inclines.

9. The manufacturing method of claim 8, wherein
when the exposure of the photoresist material is performed, the inclination angles of the first sidewalls adjacent to the non-light-emitting cells among the sidewalls facing each other in the two adjacent banks defining the first light-emitting cell and the two adjacent banks defining the third light-emitting cell are made larger than the inclination angles of the second sidewalls adjacent to the second light-emitting cell among the sidewalls facing each other in the two adjacent banks defining the first light-emitting cell and the two adjacent banks defining the third light-emitting cell, by causing a part of the photoresist material corresponding to the first sidewalls adjacent to the non-light-emitting cells to be exposed to a larger amount of light than a part of the photoresist material corresponding to the second sidewalls adjacent to the second light-emitting cell.

10. The manufacturing method of claim 8, wherein
when the exposure of the photoresist material is performed, the inclination angles of the first sidewalls adjacent to the non-light-emitting cells among the sidewalls facing each other in the two adjacent banks defining the first light-emitting cell and the two adjacent banks defining the third light-emitting cell are made larger than the inclination angles of the second sidewalls adjacent to the second light-emitting cell among the sidewalls facing each other in the two adjacent banks defining the first light-emitting cell and the two adjacent banks defining the third light-emitting cell, by using different masks for respective parts of the photoresist material corresponding to the first sidewalls and the second sidewalls so that a light transmissivity at a part of the photoresist material corresponding to the first sidewalls adjacent to the non-light-emitting cells is lower than a light transmissivity at a part of the photoresist material corresponding to the second sidewalls adjacent to the second light-emitting cell.

11. The manufacturing method of claim 8, wherein
after the photoresist material is exposed and developed, the inclination angles of the first sidewalls adjacent to the non-light-emitting cells among the sidewalls facing each other in the two adjacent banks defining the first light-emitting cell and the two adjacent banks defining the third light-emitting cell are made larger than the inclination angles of the second sidewalls adjacent to the second light-emitting cell among the sidewalls facing each other in the two adjacent banks defining the first light-emitting cell and the two adjacent banks defining the third light-emitting cell, by additionally performing an exposure process onto a part of the photoresist material corresponding to the first sidewalls adjacent to the non-light-emitting cells.

12. An organic display device including an organic light-emitting panel manufactured by the manufacturing method defined in claim 8.

13. An organic light-emitting panel, comprising:
an array of a plurality of pixels;

non-light-emitting cells, each being provided between a different pair of adjacent pixels;

a plurality of light-emitting cells provided in such a manner that each pixel includes at least three light-emitting cells that are arranged in an alignment and emit light of different colors, the at least three light-emitting cells including a first light-emitting cell located at an end of the alignment, a second light-emitting cell located at a central portion of the alignment, and a third light-emitting cell located at another end of the alignment;

an underlying layer below the array of the plurality of pixels;

a plurality of first electrodes, each included in the underlying layer and below a different one of the plurality of light-emitting cells;

a plurality of organic light-emitting layers each in a different one of the plurality of light-emitting cells by applying, for each pixel, at least three types of ink, that contain different organic light-emitting materials corresponding one-to-one to the different colors of the light, respectively to the at least three light-emitting cells substantially at a same time;

a second electrode away from the underlying layer with each organic light-emitting layer therebetween; and a plurality of banks above the underlying layer, separating the light-emitting cells, and defining each light-emitting cell, each of the plurality of pixels being structured such that:

among sidewalls facing each other in two adjacent banks defining the first light-emitting cell and two adjacent banks defining the third light-emitting cell, first sidewalls adjacent to the non-light-emitting cells have larger inclination angles than second sidewalls adjacent to the second light-emitting cell, third sidewalls facing each other in two adjacent banks defining the second light-emitting cell have substantially equal inclination angles, and an inclination angle of each of the first sidewalls, the second sidewalls, and the third sidewalls is formed between each of the first sidewalls, the second sidewalls, and the third sidewalls and an upper surface of the underlying layer, on which each of the first sidewalls, the second sidewalls, and the third sidewalls is provided, wherein in a cross-section taken along a direction of the alignment of the first light-emitting cell, the second light-emitting cell, and the third light-emitting cell in each of the plurality of pixels, among the two adjacent banks defining the first light-emitting cell and the two adjacent banks defining the third light-emitting cell, banks including the first sidewalls and adjacent to the non-light-emitting cells are asymmetric and banks including the second sidewalls and adjacent to the second light-emitting cell are symmetric.

14. The organic light-emitting panel of claim 13, wherein each of the non-light-emitting cells includes none of the organic light-emitting layers, includes a third electrode made of a same material as a material of the first electrodes, is below the second electrode, and electrically connects the third electrode with the second electrode.

15. The organic light-emitting panel of claim 13, wherein the first sidewalls adjacent to the non-light-emitting cells among the sidewalls facing each other in the two adjacent banks defining the first light-emitting cell and the two adjacent banks defining the third light-emitting cell have substantially equal inclination angles.

16. The organic light-emitting panel of claim 13, wherein the second sidewalls adjacent to the second light-emitting cell among the sidewalls facing each other in the two adjacent banks defining the first light-emitting cell and the two adjacent banks defining the third-light emitting cell and the third sidewalls facing each other in the two adjacent banks defining the second light-emitting cell have substantially equal inclination angles.

17. The organic light-emitting panel of claim 13, wherein one of the second sidewalls adjacent to the second light-emitting cell among the sidewalls facing each other in the two adjacent banks defining the third light-emitting cell and the third sidewalls facing each other in the two adjacent banks defining the second light-emitting cell have substantially equal inclination angles.

18. The organic light-emitting panel of claim 13, wherein the inclination angles of the first sidewalls adjacent to the non-light-emitting cells among the sidewalls facing each other in the two adjacent banks defining the first light-emitting cell and the two adjacent banks defining the third light-emitting cell are in a range from 35 degrees to 45 degrees inclusive, the inclination angles of the second sidewalls adjacent to the second light-emitting cell among the sidewalls facing each other in the two adjacent banks defining the first light-emitting cell and the two adjacent banks defining the third light-emitting cell are in a range from 25 degrees to 35 degrees inclusive, and the inclination angles of the third sidewalls facing each other in the two adjacent banks defining the second light-emitting cell are in a range from 25 degrees to 35 degrees inclusive.

19. An organic display device including the organic light-emitting panel defined in claim 13.

* * * * *